(12) United States Patent
Lee et al.

(10) Patent No.: US 11,437,445 B2
(45) Date of Patent: Sep. 6, 2022

(54) DISPLAY DEVICE

(71) Applicant: Samsung Display Co., Ltd., Yongin-si (KR)

(72) Inventors: Jongsoo Lee, Hwaseong-si (KR); Jong-Won Choo, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/165,716

(22) Filed: Feb. 2, 2021

(65) Prior Publication Data

US 2021/0288118 A1    Sep. 16, 2021

(30) Foreign Application Priority Data

Mar. 13, 2020    (KR) .................. 10-2020-0031198

(51) Int. Cl.
*G09G 5/00*    (2006.01)
*H01L 27/32*    (2006.01)
*H01L 51/52*    (2006.01)

(52) U.S. Cl.
CPC .......... *H01L 27/323* (2013.01); *H01L 27/326* (2013.01); *H01L 51/5253* (2013.01); *H01L 51/5284* (2013.01)

(58) Field of Classification Search
CPC . H01L 27/323; H01L 27/326; H01L 27/3223; H01L 27/3276; H01L 27/3258; H01L 27/3262; H01L 27/3272; H01L 51/5253; H01L 51/5284; H01L 51/5293; H01L 51/5246; H01L 51/5243; H01L 51/0097; H01L 51/5228; G06F 1/1607; G06F 3/0446; G06F 2203/04112

USPC ........................................................ 345/173
See application file for complete search history.

(56) References Cited

U.S. PATENT DOCUMENTS

| | | | |
|---|---|---|---|
| 8,736,162 B2 | 5/2014 | Jin et al. | |
| 10,061,356 B2 | 8/2018 | Jin et al. | |
| 10,303,014 B2 | 5/2019 | Oh | |
| 10,437,113 B2 | 10/2019 | Lee et al. | |
| 2016/0093684 A1* | 3/2016 | Youk | H01L 51/5246 257/40 |
| 2017/0263564 A1* | 9/2017 | Kim | H01L 51/0012 |
| 2018/0269427 A1* | 9/2018 | Park | H01L 27/3276 |
| 2019/0317627 A1 | 10/2019 | Kim et al. | |
| 2020/0035762 A1* | 1/2020 | Kim | H01L 27/323 |
| 2020/0044006 A1* | 2/2020 | Lee | H01L 27/3276 |
| 2020/0083301 A1* | 3/2020 | Bok | H01L 27/3272 |

FOREIGN PATENT DOCUMENTS

| | | |
|---|---|---|
| KR | 10-2008-0076554 | 8/2008 |
| KR | 10-2011-0032341 | 3/2011 |
| KR | 10-1320384 | 10/2013 |
| KR | 10-1482629 | 5/2015 |
| KR | 10-2017-0031837 | 3/2017 |
| KR | 10-2017-0139214 | 12/2017 |
| KR | 10-2019-0119366 | 10/2019 |

* cited by examiner

*Primary Examiner* — Jennifer T Nguyen
(74) *Attorney, Agent, or Firm* — H.C. Park & Associates, PLC

(57) ABSTRACT

A display device includes: an electronic module; and an electronic panel including: a first area overlapping the electronic module; a second area surrounding at least a portion of the first area in a plan view; and an indicia disposed on the first area.

18 Claims, 14 Drawing Sheets

DISPLAY DEVICE

CROSS-REFERENCE TO RELATED APPLICATION

This application claims priority from and the benefit of Korean Patent Application No. 10-2020-0031198, filed on Mar. 13, 2020, which is hereby incorporated by reference for all purposes as if fully set forth herein.

BACKGROUND

Field

Exemplary implementations of the invention relate generally to a display device, and more specifically, to a display device including an electronic module, in an display area.

Discussion of the Background

Multimedia devices such as televisions, mobile phones, tablet computers, navigators, game consoles, and the like include display devices that provide an image to a user.

In recent years, various types of display devices have been developed with the development of technology of display devices. In addition, a display device having a larger display area (or active area) and a smaller non-display area (or bezel area) has been developed for user convenience and product aesthetics.

The display device may include an electronic module, such as a camera or a sensor, that receives an external signal or provides an output signal to the outside. The electronic module is accommodated in an outer case or the like together with a display panel of the display device.

The above information disclosed in this Background section is only for understanding of the background of the inventive concepts, and, therefore, it may contain information that does not constitute prior art.

SUMMARY

Applicant realized that when an electronic module is provided in the display (non-bezel) area of a display device having a bezel area, it is difficult to align the electronic panel and window module of the display device.

Display devices constructed according to the principles and exemplary implementations of the invention provide effective and precise alignment between the electronic panel and the window module of the display device, e.g., by providing alignment indicia in the electronic panel. Thus, the production efficiency of the display device may be improved.

In addition, display devices constructed according to the principles and exemplary implementations of the invention have a reduced bezel area and can be easily manufactured even though the bezel area is reduced.

Additional features of the inventive concepts will be set forth in the description which follows, and in part will be apparent from the description, or may be learned by practice of the inventive concepts.

According to an aspect of the invention, a display device includes: an electronic module; and an electronic panel including: a first area overlapping the electronic module; a second area surrounding at least a portion of the first area in a plan view; and an indicia disposed in the first area.

The first area may include a panel module area including a central area and a pattern area surrounding the central area, the second area may include an active area, and the indicia may include an alignment mark is disposed in the pattern area.

The electronic panel may further include: a base layer; a plurality of pixels disposed in the active area on the base layer; and an encapsulation layer disposed on the base layer to cover the pixels, wherein the alignment mark may be disposed on the encapsulation layer.

The electronic panel may further include: a base layer; a plurality of pixels disposed in the active area on the base layer; an encapsulation layer disposed on the base layer to cover the pixels; and an input sensing layer disposed on the encapsulation layer and comprising a plurality of sensing patterns and a plurality of sensing insulation layers disposed between the sensing patterns.

The alignment mark and one of the plurality of sensing patterns may be disposed on a same layer.

The plurality of sensing insulation layers may include a first sensing insulation layer and a second sensing insulation layer, and the alignment mark may be disposed between the first sensing insulation layer and the second sensing insulation layer.

The encapsulation layer may include: a first inorganic layer; a second inorganic layer disposed on the first inorganic layer; and an organic layer disposed between the first inorganic layer and the second inorganic layer, wherein the first inorganic layer may not overlap the central area.

The second inorganic layer may overlap the central area.

The second inorganic layer may have a light transmittance greater than that of the first inorganic layer.

The display device may further include a window disposed on the encapsulation layer, wherein the window may include: a window substrate including a window module area overlapping the panel module area in a plan view; and a light blocking layer disposed in the window module area on one surface of the window substrate.

The window module area may include: a transmission area overlapping the central area in a plan view; and a light blocking pattern area surrounding the transmission area, wherein the light blocking layer may be disposed in the light blocking pattern area.

The light blocking pattern area may overlap the pattern area in a plan view.

The electronic panel may further include: a base layer; an insulation layer disposed on the base layer; a plurality of pixels disposed in the active area on the base layer; and an encapsulation layer disposed on the base layer to cover the pixels, wherein the alignment mark may be disposed between the insulation layer and the encapsulation layer.

The indicia may have conductivity.

The indicia may be optically opaque.

According to another aspect of the invention, a display device includes: an electronic module; and an electronic panel that is divided into a first area overlapping the electronic module and second area surrounding at least a portion of the first area in a plan view, wherein the electronic panel includes: a plurality of pixels disposed in the second area; an encapsulation layer configured to cover the pixels; and an indicia disposed on the encapsulation layer overlapping the first area in a plan view.

The first area may include a panel module area having a central area and a pattern area surrounding the central area, the second area may include an active area, and the indicia may include an alignment mark disposed in the pattern area.

The encapsulation layer may include: a first inorganic layer; a second inorganic layer disposed on the first inorganic layer; and an organic layer disposed between the first inorganic layer and the second inorganic layer, wherein the first inorganic layer may not overlap the central area, and the second inorganic layer overlaps the central area.

The display device may further include a window disposed on the encapsulation layer, wherein the window may include: a window substrate comprising a window module area overlapping the panel module area in a plan view; and a light blocking layer disposed in the window module area on one surface of the window substrate.

The window module area may include: a transmission area overlapping the central area in a plan view; and a light blocking pattern area surrounding the transmission area, wherein the light blocking layer may be disposed in the light blocking pattern area.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
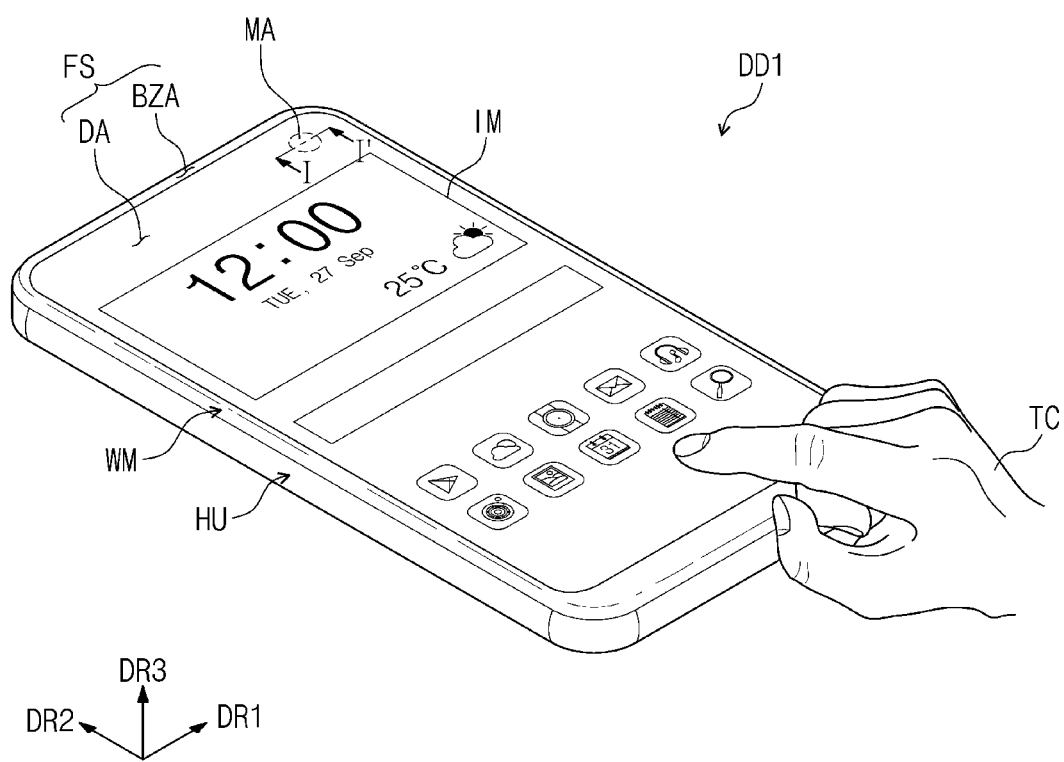
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the invention will be described with reference to the accompanying drawings.

FIG. 1 is a perspective view of an exemplary embodiment of a display device constructed according to the principles of the invention.

The display device DD1 may be implemented in various exemplary embodiments. For example, the display device DD1 may be included in or implemented as a tablet, a notebook, a computer, a smart television, and the like. In this exemplary embodiment, a smart phone will be described as an example of the display device DD1.

Referring to FIG. 1, the display device DD1 may display an image IM on a front surface FS. The front surface FS may be defined in substantially parallel to a surface defined by a first direction DR1 and a second direction DR2. The front surface FS may include a display area DA and a bezel area BZA adjacent to the display area DA.

The display device DD1 displays the image IM in the display area DA. In FIG. 1, the image IM is shown as a watch and a plurality of icons as an example.

The display area DA may have a generally rectangular shape that is substantially parallel to the first direction DR1 and the second direction DR2. However, this is merely an example. For example, the display area DA may have various shapes and the exemplary embodiments are not limited to a specific shape.

The bezel area BZA is adjacent to the display area DA. The bezel area BZA may surround the display area DA. However, this is merely an example. For example, the bezel area BZA may be disposed adjacent to only one side of the display area DA or be omitted.

A normal direction of the front surface FS may correspond to the thickness direction (hereinafter, referred to as a third direction DR3) of the display device DD1. In this exemplary embodiment, a front surface (or a top surface) or a rear surface (or a bottom surface) of each of members may be defined based on a direction in which the image IM is displayed. The front and rear surfaces may be opposite to each other in the third direction DR3.

The directions indicated as the first to third directions DR1, DR2, and DR3 may be a relative concept and thus changed into different directions.

The display device DD1 may sense a user's input TC applied from the outside. The user's input TC includes various types of external inputs such as a portion of user's body, light, heat, a pressure, or the like. Also, the display device DD1 may sense not only an input contacting the display device DD1 but also another input that is close or adjacent to the display device DD1.

In this exemplary embodiment, the user's input TC is illustrated as a user's hand applied to the front surface of the display device DD1. However, this is merely an example, and as described above, the user's input TC may be provided in various forms. Also, the display device DD1 may sense an input TC of the user, which is applied to a side or rear surface of the display device DD1, according to the structure of the display device DD1, but the exemplary embodiments are not limited to a specific structure.

The display device DD1 may include a window WM and an outer case HU. The window WM and the outer case HU may be coupled to each other to define the outer appearance of the display device DD1.

The window WM may include glass or plastic. The window WM may has a single or multilayered structure. For example, the window WM may have a laminated structure of a plurality of plastic films bonded to each other by using an adhesive or a laminated structure of a glass substrate and a plastic film, which are bonded to each other by using an adhesive. The front surface FS of the display device DD1 may be substantially defined by the front surface FS of the window WM.

A module area MA may be defined on the display area DA of the display device DD1. The module area MA may be an area that overlaps an electronic module described below. The display device DD1 may receive an external signal required for the electronic module or provide a signal output from the electronic module through the module area MA. In an exemplary embodiment, the module area MA may be disposed in the display area DA instead of the bezel area BZA, and thus, the surface area of the bezel area BZA may be reduced.

Figure 2:
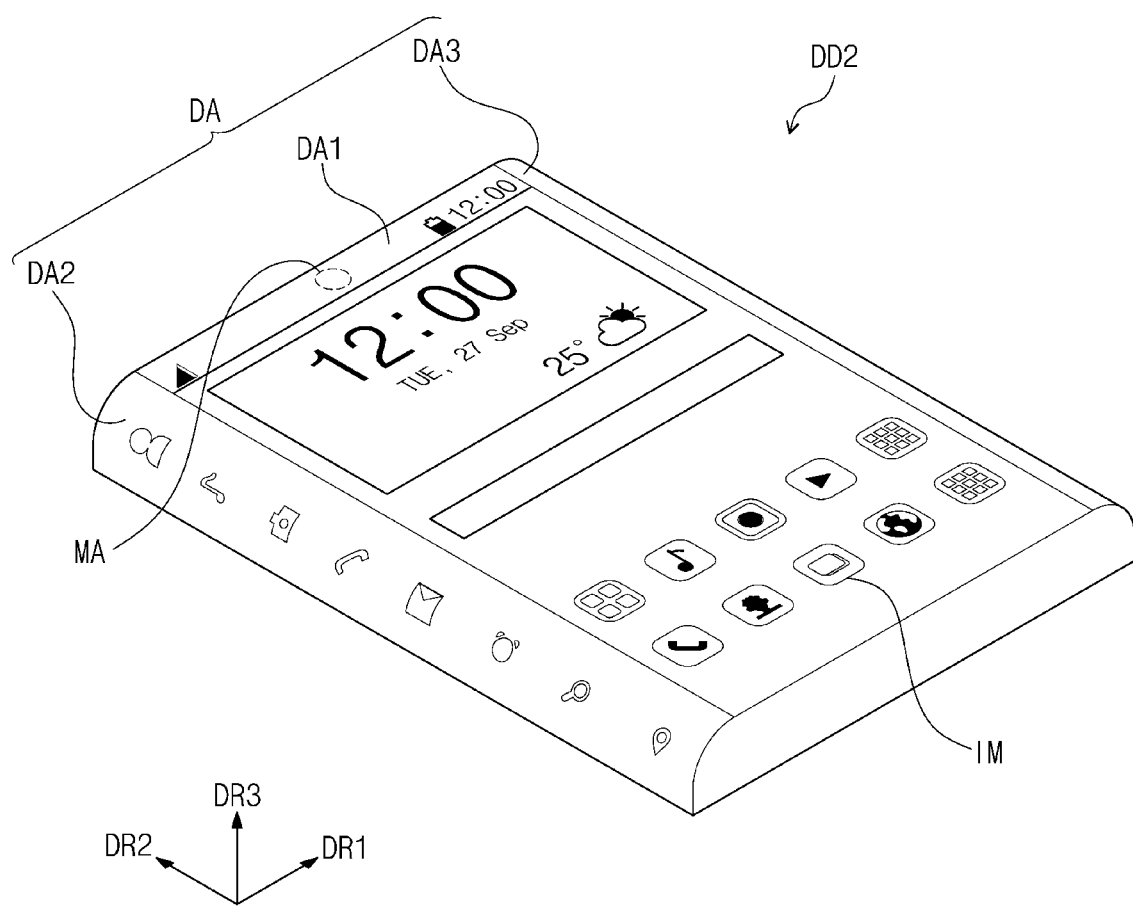
FIG. 2 is a perspective view of another exemplary embodiment of a display device constructed according to the principles of the invention.

FIG. 2 is a perspective view of another exemplary embodiment of a display device constructed according to the principles of the invention.

The display device DD2 of FIG. 2 includes a display area DA. The display area DA includes a first display area DA1 that displays an image IM through a front surface thereof and second and third display areas DA2 and DA3, each of which displays the image IM through a side surface thereof.

Each of the first to third display areas DA1 to DA3 may be independently driven to display an individual image IM. Alternatively, the first to third display areas DA1 to DA3 may be driven as one display area DA to display one image.

The front surface (for example, a display surface in the third direction DR3) of the display device DD2 may include only a display area DA, but may not include a bezel area. Also, a module area MA may be defined on the display area DA. The module area MA may be an area that overlaps an electronic module described below.

Figure 3:
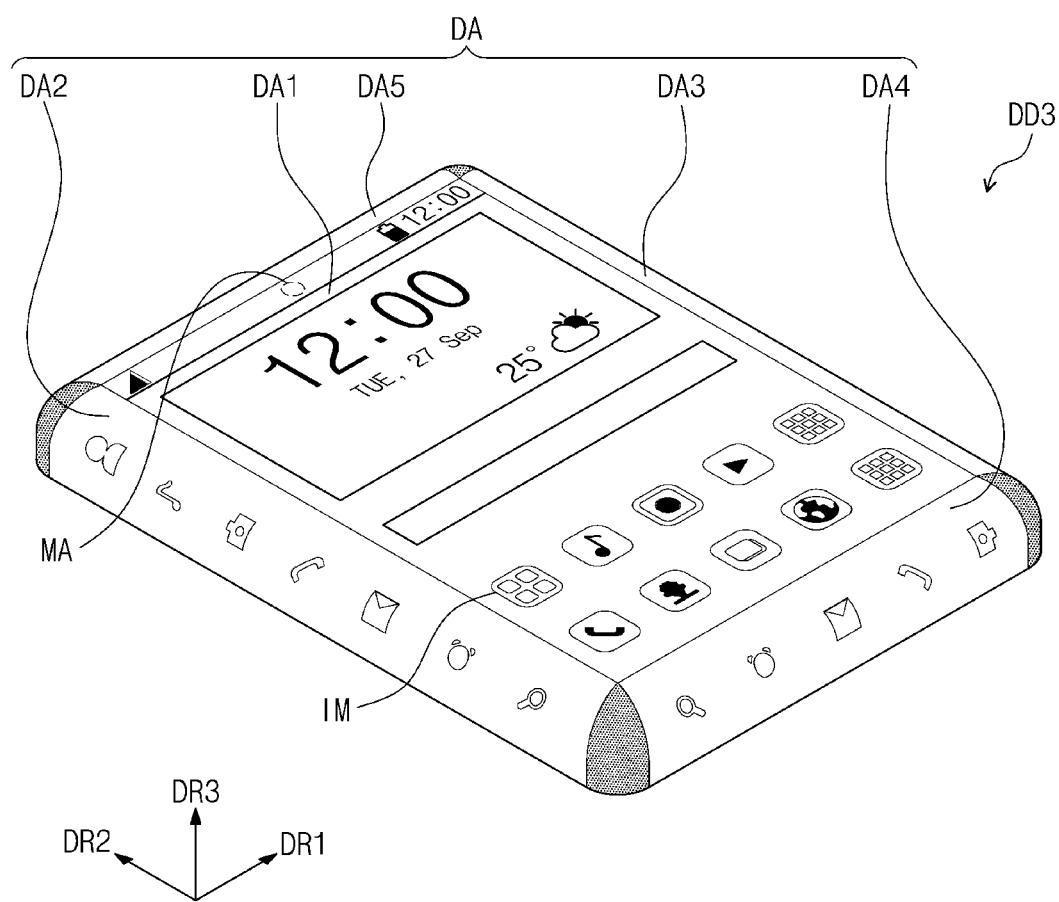
FIG. 3 is a perspective view of another exemplary embodiment of a display device constructed according to the principles of the invention.

FIG. 3 is a perspective view of another exemplary embodiment of a display device constructed according to the principles of the invention.

As illustrated in FIG. 3, a display area DA may be defined on the display device DD3.

The display area DA includes a first display area DA1 that displays an image IM through a front surface thereof and second to fifth display areas DA2 to DA5, each of which displays the image IM through a side surface thereof.

As illustrated in FIG. 3, the display device DD3 may be a four-face bent display device including the second to fifth display areas DA2 to DA5 disposed on a curved side surface thereof.

The display area DA of the display device DD3 is disposed not only on the front surface (for example, the display surface in the third direction DR3) of the display device DD3 but also on the side surfaces of the display device DD3. The display device DD3 may not include bezel areas on the front and side surfaces. Also, a module area MA may be defined on the display area DA. The module area MA may be an area that overlaps an electronic module described later.

The display device DD1 illustrated in FIG. 1 includes the bezel area BZA, but the display devices DD2 and DD3 illustrated in FIGS. 2 and 3 do not include the bezel area. All the display devices DD1 to DD3 include the module area MA defined in the display area DA.

In FIG. 1 to FIG. 3, the module area MA may be disposed on a predetermined position within the display area DA. In the example illustrated in FIG. 1, the module area MA is disposed on an upper end of a right side of the display area DA. In the example illustrated in FIGS. 2 and 3, the module area MA is disposed on an upper end of a center of the display area DA. The module area MA may be disposed on at least one of a second display area DA2 and a third display area DA3, which are disposed on the side surface of the display device DD2. Also, the module area MA may be disposed on at least one of the second display areas to fifth display areas DA2 to DA5, which are disposed on the side surface of the display device DD3.

Figure 4:
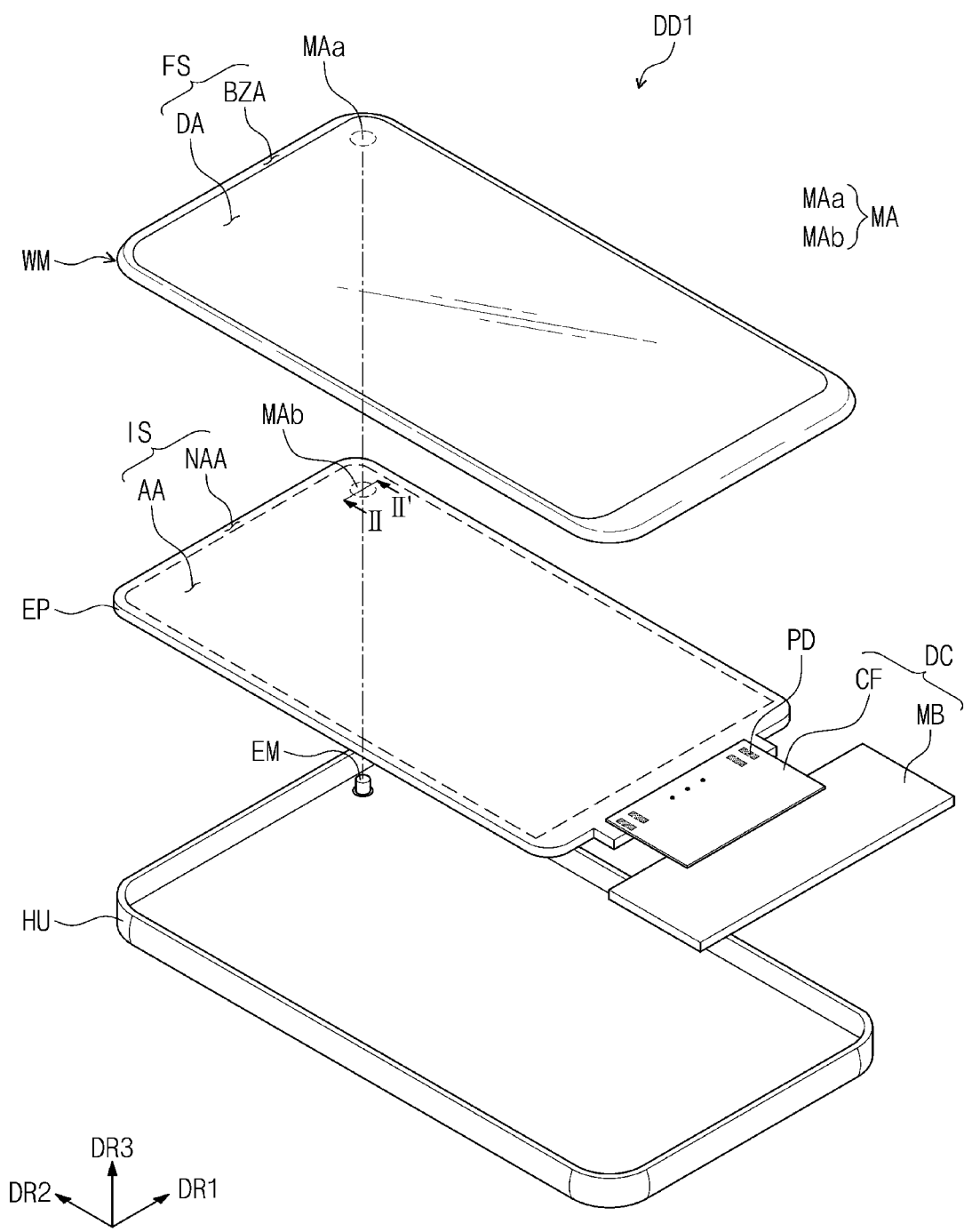
FIG. 4 is an exploded perspective view of the display device of FIG. 1.

FIG. 4 is an exploded perspective view of the display device of FIG. 1.

Referring to FIG. 4, the display device DD1 may include a window WM, an electronic panel EP, a circuit board DC, an electronic module EM, and an outer case HU. The window WM and the outer case HU may be coupled to each other to define an outer appearance of the display device DD1.

The window WM is disposed on the electronic panel EP to cover a front surface IS of the electronic panel EP. The window WM may include an optically transparent insulation material. For example, the window WM may include glass or plastic. The window WM may have a single layer or multilayered structure. For example, the window WM may have a laminated structure of a plurality of plastic films bonded to each other by using an adhesive or a laminated structure of a glass substrate and a plastic film, which are bonded to each other by using an adhesive.

The window WM includes a front surface FS that is exposed to the outside. The front surface FS of the display device DD1 may be substantially defined by the front surface FS of the window WM.

A display area DA of the window WM may be an optically transparent area. The display area DA may have a shape corresponding to an active area AA of the electronic panel EP. For example, the display area DA overlaps substantially the entire surface or at least a portion of the active area AA. An image IM displayed on the active area AA of the electronic panel EP may be visible through the display area DA from the outside.

A bezel area BZA may be an area having a light transmittance that is relatively less than that of the display area DA. The bezel area BZA defines the shape of the active area AA. The bezel area BZA may be disposed adjacent to the display area DA to surround the display area DA.

The bezel area BZA may have a predetermined color. When the window WM is provided as a glass or plastic substrate, the bezel area BZA may be a color layer that is printed or deposited on one surface of the glass or plastic substrate. Alternatively, the bezel area BZA may be formed by coloring a corresponding area of the glass or plastic substrate.

The bezel area BZA may cover the peripheral area NAA of the electronic panel EP to prevent the peripheral area NAA from being visible from the outside. This is just an example, and the window WM of each of the display devices DD2 and DD3 illustrated in FIGS. 2 and 3 may not include the bezel area BZA.

The electronic panel EP may display the image IM and detect the user's input TC (see FIG. 1). The electronic panel EP includes a front surface IS including an active area AA and a peripheral area NAA. The active area AA may be an area that is activated according to an electrical signal.

In this exemplary embodiment, the active area AA may be an area on which the image IM (see FIG. 1) is displayed and also may be an area on which the user's input TC (see FIG. 1) is detected. The display area DA overlaps at least active area AA. For example, the display area DA overlaps substantially the entire surface or at least a portion of the active area AA. Thus, the user may see the image IM or provide the user's input TC through the display area DA. However, this is merely an example. For example, an area of the active area AA, on which the image IM is displayed, and an area of the active area AA, on which the user's input TC is sensed, may be separate from each other, and the exemplary embodiments are not limited thereto.

The peripheral area NAA may be an area covered by the bezel area BZA. The peripheral area NAA is adjacent to the active area AA. The peripheral area NAA may surround the active area AA. A driving circuit or a driving line for driving the active area AA may be disposed in the peripheral area NAA.

Various signal lines for providing electrical signals to the active area AA, pads ISL-PD and DP-PD (see FIG. 6), or electronic elements may be disposed on a peripheral area NAA. The peripheral area NAA may be covered by the bezel area BZA and thus may not be visible from the outside.

In this exemplary embodiment, the electronic panel EP may be assembled in a state in which the active area AA and the peripheral area NAA are flat to face the window WM. However, this is merely an example. For example, a portion of the peripheral area NAA of the electronic panel EP may be bent. Here, a portion of the peripheral area NAA may face a rear surface of the display device DD1 to reduce a surface area of the bezel area BZA on the front surface FS of the display device DD1. Alternatively, the electronic panel EP may be assembled in a state in which a portion of the active area AA is bent. Alternatively, in the electronic panel EP, the peripheral area NAA may be omitted.

The electronic panel EP and the window WM may be bonded to each other by a transparent adhesive member such as a pressure sensitive adhesive film (PSA), an optically clear adhesive film (OCA), or an optically clear resin (OCR).

Also, an anti-reflector may be further disposed between the electronic panel EP and the window WM. The anti-reflector reduces reflectance of external light incident from an upper side of the window WM. In an exemplary embodiment, the anti-reflector may include a phase retarder and a polarizer.

A window module area MAa of the window WM and a panel module area MAb of the electronic panel EP are defined at a position overlapping the electronic module EM in a plan view, which will be described below. Also, the window module area MAa of the window WM and the panel module area MAb of the electronic panel EP correspond to a module area MA of the display device DD1 illustrated in FIG. 1. The module areas MAa and MAb may be areas that overlap a main body such as a body or housing constituting the electronic module EM, in addition to a portion of the electronic module EM, which receives or outputs light.

The module areas MAa and MAb may be variously defined in shape. In this illustrated embodiment, for ease of explanation, each of the module areas MAa and MAb are illustrated as having a circular shape, but the exemplary embodiments are not limited thereto. For example, each of the module areas MAa and MAb may have various shapes, e.g., an oval shape, a polygonal shape, and a shape having curved or straight sides, but the exemplary embodiments are not limited to a specific shape.

At least a portion of the panel module area MAb of the electronic panel EP may be surrounded by the active area AA. In this illustrated embodiment, the panel module area MAb is spaced apart from the peripheral area NAA. The module area MA is illustrated as being defined inside the active area AA so that all edges are surrounded by the active area AA. In the bonded state of the display device DD1 according to this illustrated embodiment, the window module area MAa of the window WM may overlap the display area DA and be defined at a position spaced apart from the bezel area BZA.

The circuit board DC may be connected to the electronic panel EP. The circuit board DC may include a flexible board CF and a main board MB. The flexible board CF may include an insulation film and conductive lines mounted on the insulation film. The conductive lines are connected to the pads PD to electrically connect the circuit board DC to the electronic panel EP.

The flexible board CF may be assembled in a bent state. Thus, the main board MB may be disposed on a rear surface of the electronic panel EP so as to be stably accommodated in a space provided by the outer case HU. The flexible board CF may be omitted. Here, the main board MB may be directly connected to the electronic panel EP.

The main board MB may include signal lines and electronic elements. The electronic elements may be connected to the signal lines so as to be electrically connected to the electronic panel EP. The electronic elements generate various electrical signals, for example, a signal for generating the image IM or a signal for sensing the user's input TC or process the sensed signal. The main board MB may be provided in plurality corresponding to electrical signals for generation and processing, but the exemplary embodiment are not so limited. The electronic module EM may be electrically connected to the main board MB.

In the display device DD1, a driving circuit that provides an electrical signal to the active area AA may be directly mounted on the electronic panel EP. Here, the driving circuit may be mounted in the form of a chip or may be formed together with pixels PX (to be described). Here, the circuit board DC may be reduced in surface area or omitted.

The electronic module EM is disposed below the window WM. The electronic module EM may overlap the module area MA in a plan view. The electronic module EM may receive an external input transmitted through the module area MA or provide an output through the module area MA. For example, the electronic module EM may overlap the active area AA, thereby preventing the bezel area BZA from increasing.

Figure 5:
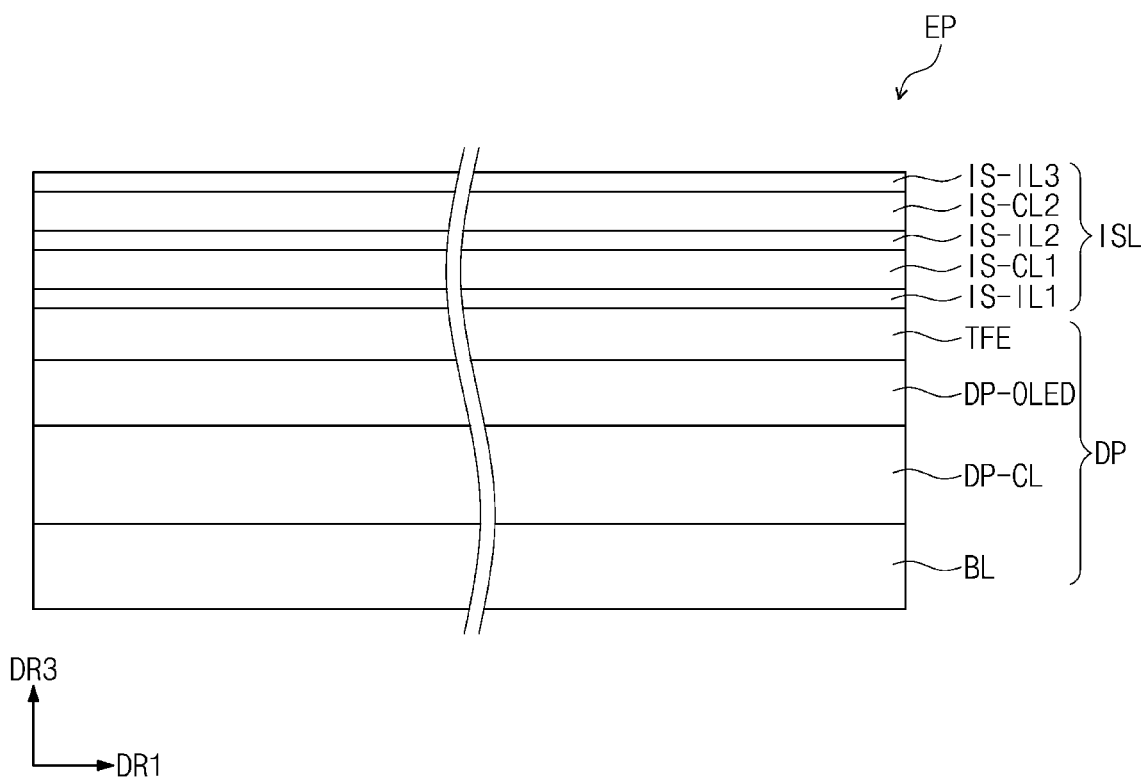
FIG. 5 is a cross-sectional view of an electronic panel of the display device of FIG. 1.

FIG. 5 is a cross-sectional view of an electronic panel of the display device of FIG. 1.

As illustrated in FIG. 5, the electronic panel EP includes a display panel DP and an input sensing layer ISL. The display panel DP is schematically illustrated to explain the stacking relationship of the input sensing layer ISL.

As illustrated in FIG. 5, the display panel DP includes a base layer BL, a circuit element layer DP-CL, a light emitting element layer DP-OLED, and a thin film encapsulation layer TFE. The input sensing layer ISL may be disposed on the thin film encapsulation layer TFE.

The input sensing layer ISL includes a first sensing insulation layer IS-IL1, a first conductive layer IS-CL1, a second sensing insulation layer IS-IL2, a second conductive layer IS-CL2, and a third sensing insulation layer IS-IL3. The first sensing insulation layer IS-IL1 may be directly disposed on the thin film encapsulation layer TFE. According to another exemplary embodiment, the first sensing insulation layer IS-IL1 may be omitted, and the first conductive layer IS-CL1 may be directly disposed on the thin film encapsulation layer TFE.

Each of the first conductive layer IS-CL1 and the second conductive layer IS-CL2 may have a single-layer structure or a multi-layered structure in which a plurality of layers are laminated in the third direction DR3. The conductive layer having the multi-layered structure may include at least two or more layers of transparent conductive layers and metal layers. The conductive layer having the multi-layered structure may include metal layers including metals different from each other. The transparent conductive layer may include indium tin oxide (ITO), indium zinc oxide (IZO), zinc oxide (ZnO), or indium tin zinc oxide (ITZO), PEDOT, a metal nano wire, and graphene. The metal layer may include molybdenum, silver, titanium, copper, aluminum, and an alloy thereof. For example, each of the first and second conductive layers IS-CL1 and IS-CL2 may have a three-layered metal structure, for example, a three-layered structure of titanium/aluminum/titanium. A metal having relatively high durability and low reflectance may be applied to an outer layer, and a metal having high electrical conductivity may be applied to an inner layer.

Each of the first and second conductive layers IS-CL1 and IS-CL2 may include a plurality of conductive patterns. Hereinafter, an example in which the first conductive layer IS-CL1 includes first conductive patterns, and the second conducive layer IS-CL2 includes second conductive patterns will be described. Each of the first and second conductive patterns may include sensing electrodes and signal lines connected to the sensing electrodes.

Each of the first sensing insulation layer IS-IL1, the second sensing insulation layer IS-IL2, and the third sensing insulation layer IS-IL3 may include an inorganic layer or an organic layer. In this exemplary embodiment, each of the first sensing insulation layer IS-IL1, the second sensing insulation layer IS-IL2, and the third sensing insulation layer IS-IL3 may be an inorganic layer. The inorganic layer may include at least one of titanium oxide, silicon oxide, silicon oxide nitride, zirconium oxide, and hafnium oxide. According to another exemplary embodiment, the first sensing insulation layer IS-IL1 may be an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Although the electronic panel EP is provided as a single substrate, and each of the display panel DP and the input sensing layer ISL is provided as a "layer" type, the exemplary embodiments are not limited thereto. In another exemplary embodiment, the display panel DP and the input sensing layer ISL may be provided as separate substrates and then be bonded to each other.

Figure 6:
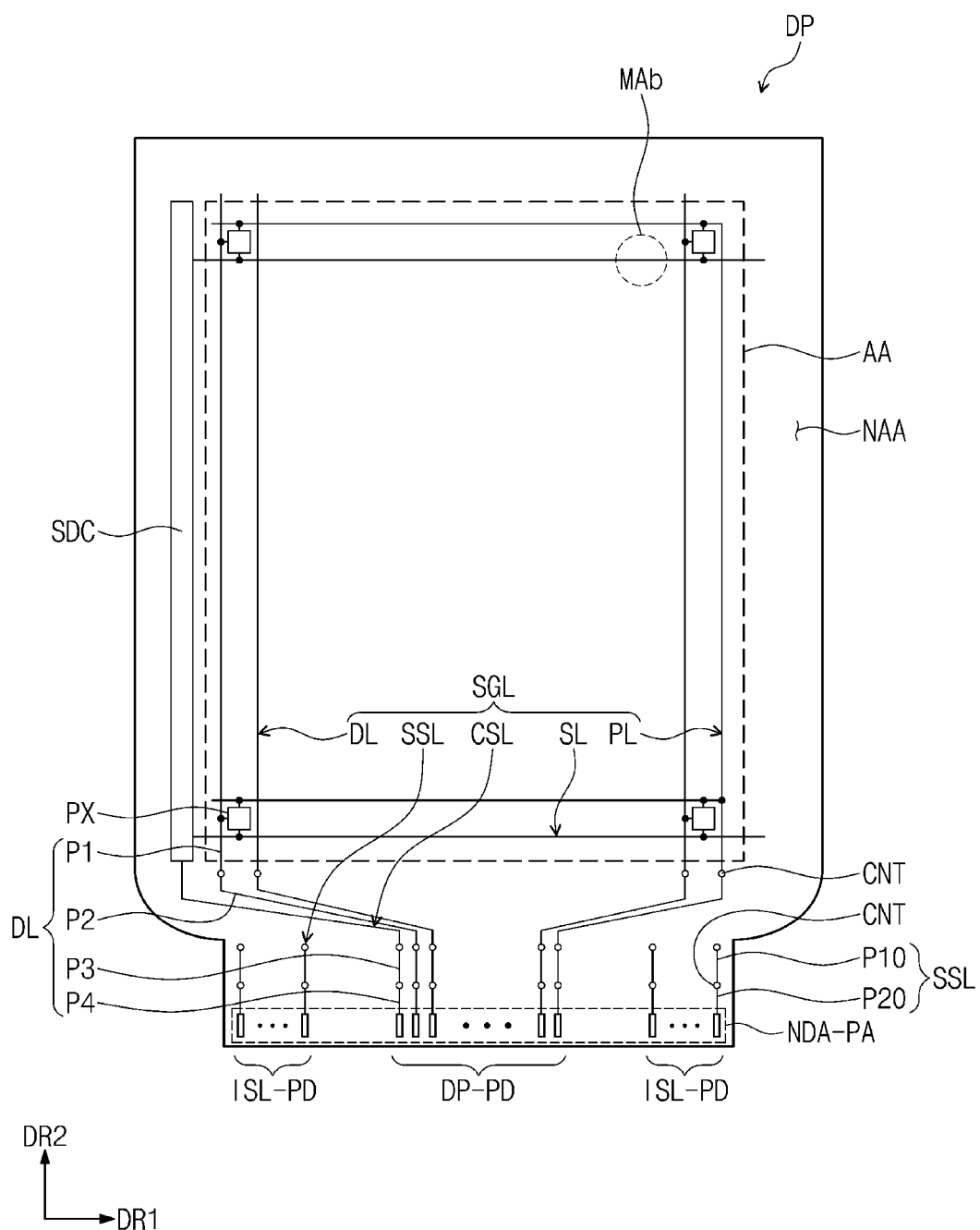
FIG. 6 is a plan view of a display panel of the display device of FIG. 1.

FIG. 6 is a plan view of a display panel of the display device of FIG. 1.

As illustrated in FIG. 6, the display panel DP includes a driving circuit SDC, a plurality of signal lines SGL (hereinafter, referred to as signal lines), a plurality of signal pads DP-PD, ISL-PD (hereinafter, referred to as signal pads), and a plurality of pixels PX (hereinafter, referred to as pixels).

The driving circuit SDC may include a scan driving circuit. The scan driving circuit generates a plurality of scan signals (hereinafter, referred to as scan signals) to sequentially output the scan signals to a plurality of scan lines SL (hereinafter, referred to as scan lines) that will be described later. The scan driving circuit may further output another control signal to the driving circuit of the pixels PX.

The scan driving circuit may include a plurality of transistors that are manufactured through the same process as the driving circuit of the pixel PX, e.g., a low temperature polycrystalline silicon (LTPS) process or a low temperature polycrystalline oxide (LTPO) process.

The signal lines SGL include scan lines SL, data lines DL, a power line PL, and a control signal line CSL. The scan lines SL are respectively connected to corresponding pixels of the pixels PX, and the data lines DL are respectively connected to corresponding pixels PX of the pixels PX. The power line PL is connected to the pixels PX. The control signal line CSL may provide control signals to the scan driving circuit.

In this exemplary embodiment, the signal lines SGL may further include auxiliary lines SSL. The auxiliary lines SSL are signal lines connected to the input sensing layer ISL (see FIG. 7). Alternatively, the auxiliary lines SSL may be omitted.

The signal lines SGL may include a plurality of portions disposed on different layers. FIG. 4 illustrates an example in which include the data lines DL including four portions P1 to P4 and the auxiliary lines SSL including two portions P10 to P20. The four portions P1 to P4 may be connected to each other through contact holes CNT. The two portions P10 and P20 may be connected to each other through the contact holes CNT. The first portion P10 of the auxiliary lines SSL is connected to the signal line of the input sensing layer ISL (see FIG. 7), which will be described below, through the contact holes CNT.

The pads PD illustrated in FIG. 4 may include signal pads DP-PD and ISL-PD. The signal pads DP-PD and ISL-PD may include first type signal pads DP-PD connected to the data lines DL, the power line PL, and the control signal line CSL and second type signal pads ISL-PD connected to the auxiliary lines SSL. The first type signal pads DP-PD and the second type signal pads ISL-PD are disposed adjacent to each other in a pad area NDA-PA defined in a portion of the peripheral area NAA. The signal pads DP-PD and ISL-PD may be formed through the same process without distinguishing laminated structures or constituent materials from each other.

The active area AA may be defined as an area on which the pixels PX are disposed. A plurality of electronic elements may be disposed on the active area AA. The electronic elements include an organic light emitting diode provided in each of the pixels PX and a pixel driving circuit connected to the organic light emitting diode. The driving circuit SDC, the signal lines SGL, the signal pads DP-PD and ISL-PD, and the pixel driving circuit may be provided in the circuit element layer DP-CL illustrated in FIG. 5.

For example, the pixel PX may include at least one transistor, at least one capacitor, and an organic light emitting diode. The pixel PX is connected to the scan line SL and the data line DL. The pixel PX receives a power voltage provided from the power line PL.

The signal pads DP-PD and ISL-PD of the display panel DP may be electrically connected to the circuit board DC illustrated in FIG. 4.

A portion of the display panel DP illustrated in FIG. 6 may be bent. A portion of the peripheral area NAA may be bent with respect to a bending axis parallel to a first direction DR1. The bending axis may be defined to overlap the second portions P3 of the data lines DL and the auxiliary lines SSL.

The panel module area MAb of the display panel DP, which is illustrated in FIG. 6, is defined within the active area AA. In an exemplary embodiment, the pixels PX may not be disposed on the panel module area MAb of the display panel DP.

Figure 7:
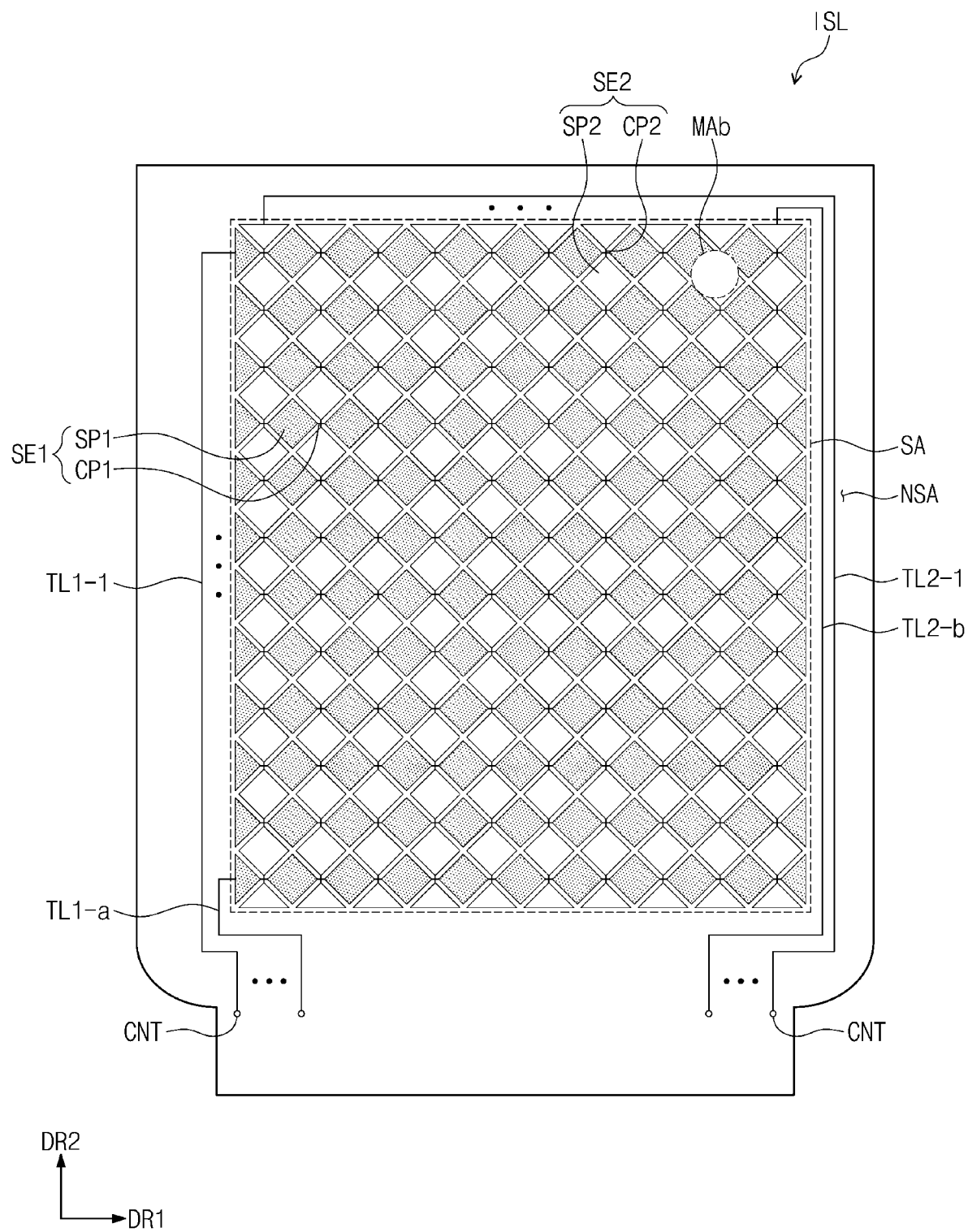
FIG. 7 is a plan view of an input sensing layer of the display device of FIG. 1.

FIG. 7 is a plan view of an input sensing layer of the display device of FIG. 1.

Referring to FIG. 7, the input sensing layer ISL is disposed on the display panel DP illustrated in FIG. 6. The input sensing layer ISL may detect the user's input TC (see FIG. 1) to obtain location or intensity information of an external touch input. The input sensing layer ISL may include a sensing area SA and a line area NSA in a plan view. The sensing area SA may be defined as an area on which first sensing electrodes SE1 and second sensing electrodes SE2 are disposed. In this exemplary embodiment, the line area NSA may be defined along an edge of the sensing area SA. The sensing area SA and the line area NSA may correspond to the active area AA and the peripheral area NAA of the display panel DP, respectively.

In this exemplary embodiment, the input sensing layer ISL may be a capacitive touch sensor. One of the first sensing electrodes SE1 and the second sensing electrodes SE2 receives a driving signal, and the other of the first sensing electrodes SE1 and the second sensing electrodes SE2 outputs an amount of change in capacitance between the first sensing electrodes SE1 and the second sensing electrodes SE2 as a sensing signal.

Each of the first sensing electrodes SE1 has a shape extending in the first direction DR1. Also, the first sensing electrodes SE1 may be sequentially arranged in the second direction DR2. The first sensing electrodes SE1 may include a plurality of first sensing patterns SP1 and a plurality of first auxiliary patterns CP1.

Each of the second sensing electrodes SE2 has a shape extending in the second direction DR2. Also, the second sensing electrodes SE2 may be sequentially arranged in the first direction DR1. The second sensing electrodes SE2 may include a plurality of second sensing patterns SP2 and a plurality of second auxiliary patterns CP2.

The first sensing lines TL1-1 to TL1-a may include the same number of signal lines as the first sensing electrodes SE1. The first sensing lines TL1-1 to TL1-a may be connected to at least one end of both ends of the first sensing electrodes SE1. The second sensing lines TL2-1 to TL2-b may include the same number of signal lines as the second sensing electrodes SE2. The second sensing lines TL2-1 to TL2-b may be connected to at least one end of both ends of the second sensing electrodes SE2.

The first sensing lines TL1-1 to TL1-a may be connected to some of the auxiliary lines SSL (see FIG. 6) disposed at one side of the pad area NDA-PA (see FIG. 6) through the contact holes CNT. The second sensing lines TL2-1 to TL2-b may be connected to some of the auxiliary lines SSL (refer to FIG. 6) disposed at the other side of the pad area NDA-PA (see FIG. 6) through the contact holes CNT.

The contact holes CNT may pass through the insulation layers disposed between the first and second sensing lines TL1-1 to TL1-a and TL2-1 to TL2-b and the auxiliary lines SSL.

The panel module area MAb of the input sensing layer ISL illustrated in FIG. 7 is defined within the sensing area SA. In an exemplary embodiment, the first sensing electrodes SE1 and the second sensing electrodes SE2 may not be disposed on the panel module area MAb of the input sensing layer ISL.

Figure 8:
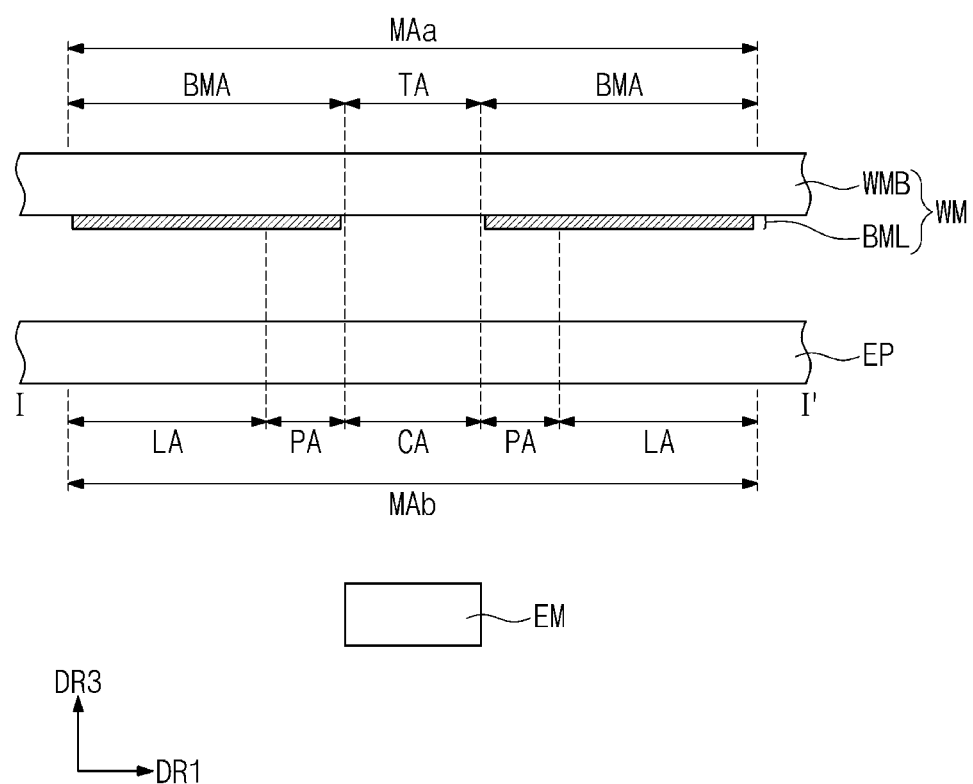
FIG. 8 is a cross-sectional view taken along line I-I' of FIG. 1.
Figure 9:
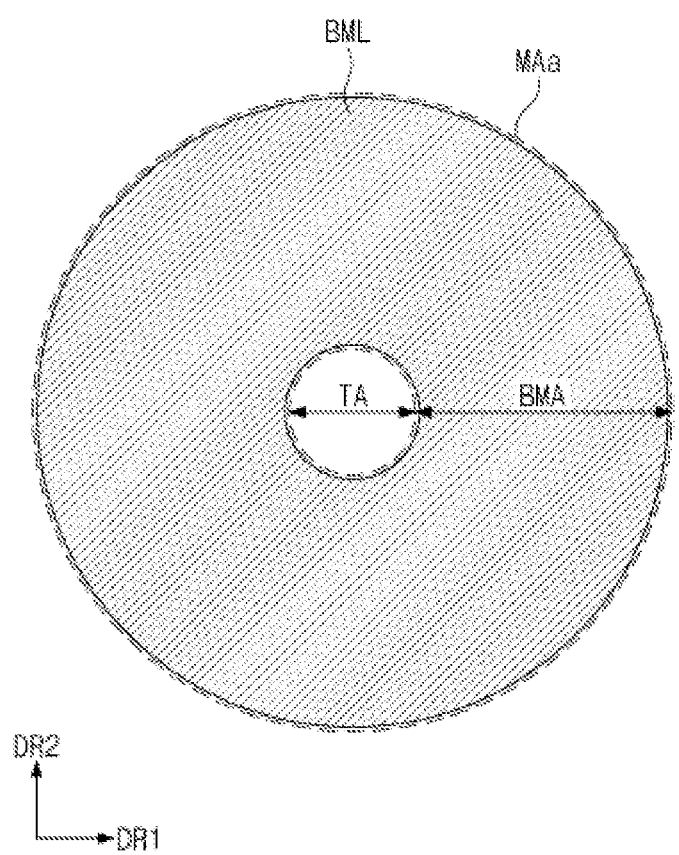
FIG. 9 is a plan view illustrating an exemplary embodiment of a window module area of a window of the display device of FIG. 1.
Figure 10:
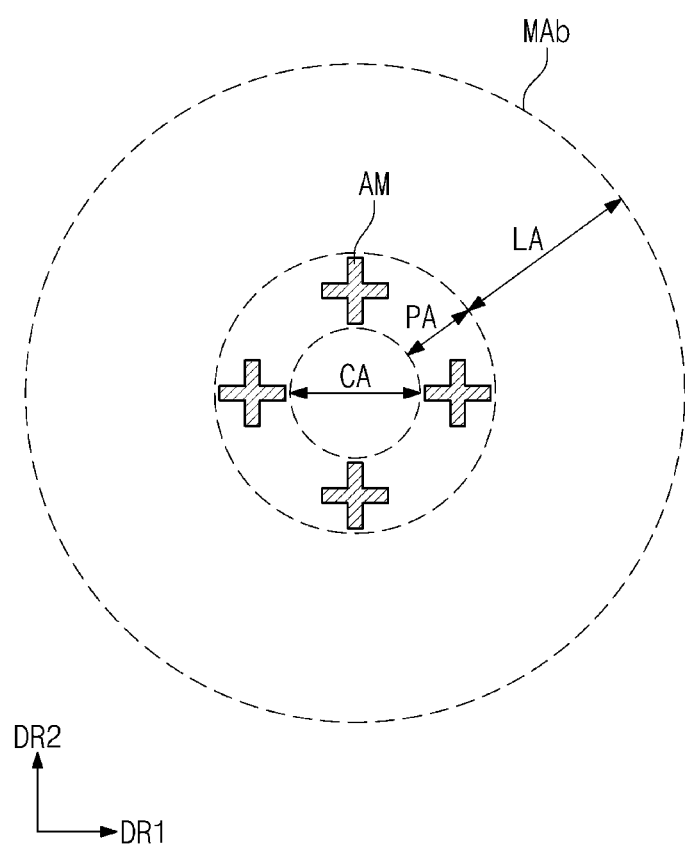
FIG. 10 is a plan view illustrating an exemplary embodiment of a panel module area of an electronic panel of the display device of FIG. 1.

FIG. 8 is a cross-sectional view taken along line I-I' of FIG. 1. FIG. 9 is a plan view illustrating an exemplary embodiment of a window module area of the window of the display device of FIG. 1 illustrating a window module area thereof. FIG. 10 is a plan view illustrating an exemplary embodiment of an electronic panel.

As illustrated in FIGS. 8, 9, and 10, the window WM includes a window substrate WMB and a light blocking layer BML. In an exemplary embodiment, the window substrate WMB may be a transparent substrate such as a glass substrate, but is not limited thereto. The window module area MAa is defined on the window substrate WMB. The window module area MAa is an area that overlaps the electronic module EM. The window module area MAa includes a transmission area TA and a light blocking pattern area BMA.

The light blocking pattern area BMA may have a shape surrounding the transmission area TA in a plan view. As illustrated in FIG. 9, when the transmission area TA has a circular shape, the light blocking pattern area BMA may have a closed curve shape (e.g., donut or annular shape) continuously extending along an edge of the transmission area TA. The shape of the light blocking pattern area BMA may be variously designed according to the shape of the transmission area TA.

The transmission area TA of the window substrate WMB may have a light transmittance so that external light is sufficiently provided to the electronic module EM. The light blocking layer BML is disposed on the light blocking pattern area BMA on one surface of the window substrate WMB. The light blocking layer BML may be directly disposed on the window substrate WMB through a deposition, printing, or coating process. The light blocking layer BML may prevent external light from being provided to the electronic module EM. Thus, the transmission area TA of the window substrate WMB may have a light transmittance greater than that of the light blocking pattern area BMA.

The light blocking layer BML may have a multi-layered structure. More specifically, the light blocking layer BML may include a plurality of layers disposed on the window substrate WMB. One of the plurality of layers may have a black color, and the other may have a colored color. In another exemplary embodiment, a film on which the light blocking layer BML is printed may be bonded to one surface of the window substrate WMB by an adhesive layer.

The panel module area MAb is defined on the electronic panel EP. The panel module area MAb is an area that overlaps the electronic module EM. Also, the panel module area MAb of the electronic panel EP overlaps the window module area MAa of the window substrate WMB. The panel module area MAb includes a central area CA, a pattern area PA, and a line area LA.

In this illustrated exemplary embodiment, the central area CA may have a generally circular shape in a plan view. The pattern area PA may have a ring (annular) shape surrounding the central area CA. The line area LA may have an annular shape surrounding the pattern area PA. However, the central area CA may be designed in various shapes according to the shape of the receiving unit or the output unit of the electronic module EM. For example, the central region CA may be designed in various shapes such as an oval shape, a polygonal shape, or a shape of which at least one side is curved as long has it can receive the electronic module EM therein.

The central area CA of the electronic panel EP may correspond to or be wider than the transmission area TA of the window substrate WMB. The pattern area PA and the line area LA of the electronic panel EP may correspond to the light blocking pattern area BMA of the window substrate WMB.

The pattern area PA may have a shape surrounding the central area CA in a plan view. As illustrated in FIG. 10, when the central area CA has a circular shape, the pattern area PA may have an annular shape surrounding the central area CA. Also, the line area LA may have a shape surrounding the pattern area PA.

The electronic panel EP includes one or more indicia that may be in the form of alignment marks AM disposed on the pattern area PA. In the example illustrated in FIG. 10, the alignment mark AM is illustrated as having a "+" shape, but the exemplary embodiments are not limited thereto. Also, in the example illustrated in FIG. 10, the alignment mark AM is provided in plural, and the arrangement interval and size of the alignment marks AM may be variously changed.

Figure 11:
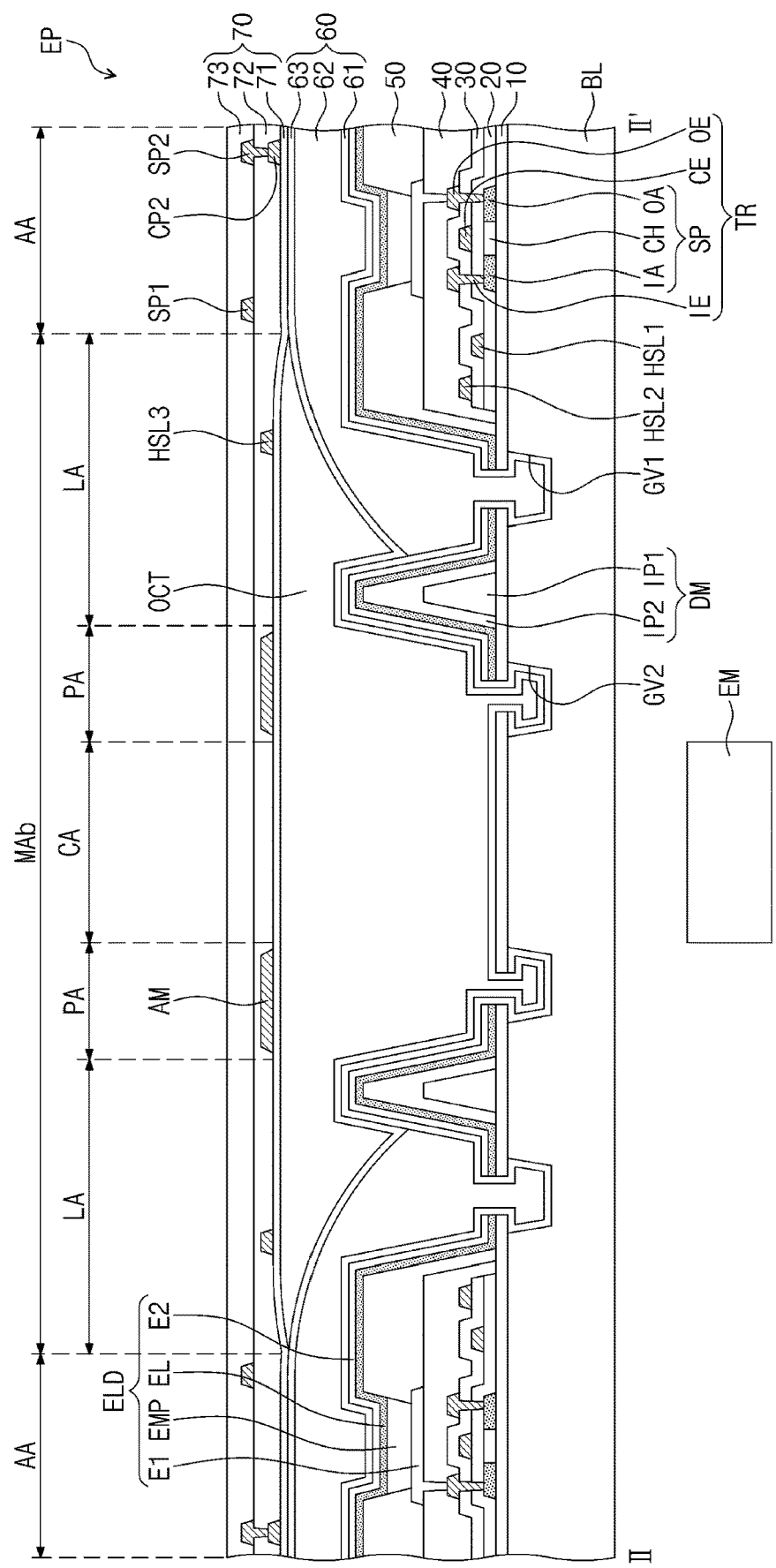
FIG. 11 is a cross-sectional view taken along line II-II' of FIG. 4 illustrating an exemplary embodiment of an electronic panel.

FIG. 11 is a cross-sectional view taken along line II-IF of FIG. 4 illustrating an example of an electronic panel of the display device of FIG. 4.

FIG. 11 illustratively illustrates some components of the display panel DP and the input sensing layer ISL among the components of the electronic panel EP for descriptive convenience. The display panel DP includes a base layer BL, a thin film transistor TR, a light emitting element ELD, a plurality of insulation layers 10, 20, 30, 40, 50, and 60, hole signal lines HSL1 and HSL2. The input sensing layer ISL includes a first sensing insulation layer IS-IL1, a second sensing insulation layer IS-IL2, a third sensing insulation layer IS-IL3, and a plurality of sensing patterns SP1 and SP2, a second auxiliary pattern CP2, and a hole signal line HSL3.

The insulation layers 10, 20, 30, 40, 50, and 60 may include first to sixth insulation layers 10, 20, 30, 40, 50, and 60, which are sequentially laminated. Each of the first to sixth insulation layers 10, 20, 30, 40, 50, and 60 may include an organic material and/or an inorganic material and may have a single layer or a laminated structure.

In this exemplary embodiment, the base layer BL may be optically transparent. For example, the base layer BL may have a visible light transmittance of about 90% or more.

The first insulation layer 10 is disposed on the base layer BL to cover a front surface of the base layer BL. The first insulation layer 10 may include a barrier layer and/or a buffer layer. Thus, the first insulation layer 10 may prevent oxygen or moisture introduced through the base layer BL from penetrating into the pixel PX or may provide a top surface having low surface energy to the pixel PX so that the pixel PX is stably formed on the base layer BL.

In this exemplary embodiment, the first insulation layer 10 may be optically transparent. For example, the first insulation layer 10 may have a visible light transmittance of about 90% or more.

The thin film transistor TR and the light emitting element ELD constitute the pixel PX (see FIG. 6). The thin film transistor TR may include a semiconductor pattern SP, a control electrode CE, an input electrode IE, and an output electrode OE. The semiconductor pattern SP is disposed on the first insulation layer 10.

The semiconductor pattern SP includes a semiconductor material. For example, the semiconductor pattern SP may include the group III elements, the group V elements, a compound of the group III elements or group V elements, or an oxide semiconductor.

The semiconductor pattern SP may be divided into a channel region CH and an input region IA and an output region OA, which are spaced apart from each other with the channel region CH therebetween. The channel region CH, the input region IA, and the output region OA may have an unitary shape integrally connected to each other.

The channel region CH may be a region overlapping the control electrode CE in a plan view. The input region IA and the output region OA may have relatively high charge mobility compared to the channel region CH. The charges within the semiconductor pattern SP may move from the input region IA to the output region OA through the channel region CH.

The control electrode CE is disposed on the second insulation layer 20. The second insulation layer 20 is disposed on the first insulation layer 10 to cover the semiconductor pattern SP. The control electrode CE may be spaced apart from the semiconductor pattern SP with the second insulation layer 20 therebetween in cross section.

The input electrode IE and the output electrode OE are disposed on the third insulation layer 30. The third insulation layer 30 is disposed on the second insulation layer 20 to cover the control electrode CE.

The input electrode IE passes through the second insulation layer 20 and the third insulation layer 30 and is connected to the input region IA. The output electrode OE is spaced apart from the input electrode IE and connected to the output region OA. Each of the input electrode IE and the output electrode OE may include a conductive material. The input electrode IE provides charges to the input region IA, and the output electrode OE transfers the electric charges moving to the output region OA to the light emitting element ELD.

In the thin film transistor TR according to this illustrated exemplary embodiment, the input electrode IE and the output electrode OE may be omitted. For example, the thin film transistor TR may be constituted by only the control electrode CE and the semiconductor pattern SP. Here, the input region IA and the output region OA may function as the input electrode IE and the output electrode OE, and the input electrode IE and the output electrode OE may function as connection electrodes that connect the thin film transistor TR to other signal lines or other elements. The thin film transistor TR may be provided in various structures and the exemplary embodiments are not limited to a specific structure.

The light emitting element ELD may include a first electrode E1, a second electrode E2, an emission pattern EMP, and a control layer EL. The first electrode E1, the second electrode E2, the emission pattern EMP, and the control layer EL of the light emitting element ELD may correspond to the light emitting element layer DP-OLED. The first electrode E1 is disposed on the fourth insulation layer 40. The fourth insulation layer 40 is disposed on the third insulation layer 30 to cover the thin film transistor TR. The first electrode E1 is connected to the output electrode OE and is electrically connected to the thin film transistor TR.

The second electrode E2 is disposed on the fifth insulation layer 50 disposed on the fourth insulation layer 40. The fifth insulation layer 50 may include an organic material and/or an inorganic material and have a single layer or multilayered structure. The second electrode E2 may have a surface area covering less than or substantially the entire surface of the active area AA. Thus, the plurality of light emitting elements ELD may include one second electrode E2 in common. However, this is merely an example. For example, a second electrode E2 may be provided for each pixel PX to correspond to the first electrode E1 and is not limited to a specific structure.

An opening exposing at least a portion of the first electrode E1 may be defined in the fifth insulation layer 50. The emission pattern EMP may be disposed in the opening. The emission pattern EMP may include a light emitting material including a fluorescent material or a phosphorescent material. The light emitting material may include an organic light emitting material or an inorganic light emitting material and the exemplary embodiments are not limited thereto.

The control layer EL is disposed between the first electrode E1 and the second electrode E2. The control layer EL may have a surface area covering less than or substantially the entire surface of the active area AA. The control layer EL may include an organic material. The control layer EL controls movement of the charges to improve luminous efficiency and lifetime of the light emitting element ELD. The control layer EL may include an electron transport material, an electron injection material, a hole transport material, or a hole injection material.

In this illustrated exemplary embodiment, the control layer EL is illustrated as being disposed on the emission pattern EMP, but this is merely an example. For example, the control layer EL may be disposed between the emission pattern EMP and the first electrode E1 or may be provided in plurality that are respectively disposed between the emission pattern EMP and the first electrode E1 and between the emission pattern EMP and the second electrode E2 but the exemplary embodiments are is not limited to a specific structure.

The sixth insulation layer 60 is disposed on the light emitting element ELD to seal the light emitting element ELD. The sixth insulation layer 60 may be the thin film encapsulation layer TFE illustrated in FIG. 5. A capping layer covering the second electrode E2 may be further disposed between the second electrode E2 and the sixth insulation layer 60.

The sixth insulation layer 60 may include a first inorganic layer 61, an organic layer 62, and a second inorganic layer 63, which are sequentially laminated in the third direction DR3. However, the exemplary embodiments are not limited thereto. For example, the sixth insulation layer 60 may further include a plurality of inorganic layers and organic layers.

The first inorganic layer 61 may cover the second electrode E2. The first inorganic layer 61 may prevent external moisture or oxygen from being permeated into the light emitting element ELD. For example, the first inorganic layer 61 may include silicon nitride, silicon oxide, or a combination thereof. The first inorganic layer 61 may be formed through a chemical vapor deposition process.

The first inorganic layer 61 may have a light transmittance less than that of the base layer BL. For example, the first inorganic layer 61 may include silicon nitride (SiNx). This will be described below in detail.

The organic layer 62 may be disposed on the first inorganic layer 61 to contact the first inorganic layer 61. The organic layer 62 may provide a flat surface on the first inorganic layer 61. A curve disposed on a top surface of the first inorganic layer 61 or particles existing on the first inorganic layer 61 may be covered by the organic layer 62 to prevent the surface state of a top surface of the first inorganic layer 61 from having an influence on the constituents disposed on the organic layer 62. Also, the organic layer 62 may reduce stress between the layers contacting each other. The organic layer 62 may include an organic material and be formed through a solution process such as spin coating, slit coating, inkjet process, and the like.

The second inorganic layer 63 may be disposed on the organic layer 62 to cover the organic layer 62. The second inorganic layer 63 may be relatively stably formed on the flat surface when compared to the second inorganic layer 63 disposed on the first inorganic layer 61. The second inorganic layer 63 may encapsulate moisture discharged from the organic layer 62 to prevent the moisture from being introduced.

The second inorganic layer 63 may be optically transparent. For example, the second inorganic layer 63 may have a visible light transmittance of about 90% or more. The second inorganic layer 63 may have a relatively high light transmittance compared to the first inorganic layer 61. The second inorganic layer 63 may include silicon oxide (SiOx) or silicon oxynitride (SiON).

The second inorganic layer 63 may be formed by a chemical vapor deposition process. Each of the first inorganic layer 61, the organic layer 62, and the second inorganic layer 63 may include a plurality of layers and is not limited to a specific structure.

In this exemplary embodiment, the input sensing layer ISL (see FIG. 7) is illustrated as being disposed on the display panel DP. However, the exemplary embodiments are not limited thereto. As described above, a first sensing pattern SP1, a second sensing pattern SP2, and a second auxiliary pattern CP2 may be some components of the input sensing layer ISL. The first sensing pattern SP1, the second sensing pattern SP2, and the second auxiliary pattern CP2 together with the seventh insulation layer 70 constitute the input sensing layer ISL.

The input sensing layer ISL may include first to third sensing insulation layers 71, 72, and 73, which are sequentially laminated. The seventh insulation layer 70 may be provided to overlap each of the active area AA and the panel module area MAb.

Each of the first to third sensing insulation layers 71, 72, and 73 may be optically transparent. For example, each of the first to third sensing insulation layers 71, 72, and 73 may have a visible light transmittance of about 90% or more. Each of the first to third sensing insulation layers 71, 72, and 73 may have an inorganic layer an organic layer, or a laminated structure thereof.

In this exemplary embodiment, the first sensing pattern SP1 and the second sensing pattern SP2 are disposed on the same layer, and the second auxiliary pattern CP2 is disposed on a layer different from the second sensing pattern SP2. Each of the first sensing pattern SP1, the second sensing pattern SP2, and the second auxiliary pattern CP2 may include transparent conductive oxide. The second auxiliary pattern CP2 may be disposed between the first sensing insulation layer 71 and the second sensing insulation layer 72. The second sensing pattern SP2 may pass through the second sensing insulation layer 72 and be connected to the second auxiliary pattern CP2. The first auxiliary pattern CP1 (see FIG. 7) and the first sensing pattern SP1 may be disposed on the same layer. For example, the first auxiliary pattern CP1 may be directly connected to the first sensing pattern SP1.

However, this is merely an example. For example, the second auxiliary pattern CP2 and the second sensing pattern SP2 may be disposed on the same layer. The first auxiliary pattern CP1 may be disposed on a layer different from the first sensing pattern SP1. Alternatively, the first sensing pattern SP1 and the second sensing pattern SP2 may be disposed on different layers. The input sensing layer ISL may be provided in various structures and the exemplary embodiments are not limited to a specific structure.

The hole signal lines HSL1, HSL2, and HSL3 are disposed in the panel module area MAb. The panel module area MAb may include a central area CA, a pattern area PA, and a line area LA.

The central area CA may be an area of the electronic module EM, which substantially overlaps the receiving unit of the electronic module EM. As used herein, "electronic module" may be any electrical device receiving an external input or an output unit providing an output, such as a camera or a sensor. For example, when the electronic module EM is a camera module, the central area CA may be an area of the panel module area MAb, which overlaps a lens. The central area CA may be an area having the highest light transmittance in the panel module area MAb.

The hole signal lines HSL1, HSL2, and HSL3 are disposed in the line area LA. In FIG. 4, for ease of description, a first hole signal line HSL1, a second hole signal line HSL2, and a third hole signal line HSL3 corresponding to some of the hole signal lines HSL1, HSL2, and HSL3 are illustrated.

The first hole signal line HSL1 and the second hole signal line HSL2 may be signal lines SGL illustrated in the display panel DP (see FIG. 6). The first hole signal line HSL1 is illustrated as being disposed between the second insulation layer 20 and the third insulation layer 30. The first hole signal line HSL1 may be a scan line SL connected to the pixels PX disposed adjacent to the panel module area MAb. The first hole signal line HSL1 may provide the same scan signal to the pixels PX, which are disposed to be spaced apart from each other with the panel module area MAb therebetween, via the line area LA.

The second hole signal line HSL2 is illustrated as being disposed between the third insulation layer 30 and the fourth insulation layer 40. The second hole signal line HSL2 may be a data line DL connected to the pixels PX, which are disposed adjacent to the panel module area MAb. The second hole signal line HSL2 electrically connects the pixels PX, which are spaced apart from each other with the panel module area MAb therebetween, via the line area LA.

The third hole signal line HSL3 is disposed on the first sensing insulation layer 71 to constitute the input sensing layer ISL. In this exemplary embodiment, the third hole signal line HSL3 is illustrated as being disposed between the first sensing insulation layer 71 and the second sensing insulation layer 72, but this is merely an example. For example, the third hole signal line HSL3 may be disposed between the second sensing insulation layer 72 and the third sensing insulation layer 73. The third hole signal line HSL3 may be a connection line connected to the sensing patterns SP1 and SP2 disposed adjacent to the panel module area MAb.

The electronic panel EP may further include at least one groove part GV1 and GV2, a dam part DM, and a planarization pattern OCT. The groove part GV1 and GV2, the dam part DM, and the planarization pattern OCT are disposed in the panel module area MAb.

The groove part GV1 and GV2 may be disposed in the line area LA of the panel module area MAb. The groove part GV1 and GV2 may be provided by recessing at least a portion of the base layer BL. The groove part GV1 and GV2 has a depth so as not to pass through the base layer BL. The groove part GV1 and GV2 may include a first groove part GV1 and a second groove part GV2, which are spaced apart from each other.

The first groove part GV1 may be defined to be relatively adjacent to the active area AA and be filled by the organic layer 62. The second groove part GV2 may be defined to be relatively adjacent to the central region CA and be sequentially covered by the first inorganic layer 61 and the second inorganic layer 63, which are spaced apart from the organic layer 62. Each of the first groove part GV1 and the second groove part GV2 has a closed line shape surrounding the central area CA or an intermittent line shape surrounding at least a portion of an edge of the central area CA, but is not limited to a specific exemplary embodiment.

An end of the first insulation layer 10 may have an undercut shape projecting from each of the first groove part GV1 and the second groove part GV2. The control layer EL and the second electrode E2 are cut off by the first groove part GV1 and the second groove part GV2, respectively. The electronic panel EP may further include the groove parts GV1 and GV2 to prevent continuity of the control layer EL or the second electrode E2 from forming a penetration path for external moisture or oxygen, thereby preventing the elements disposed in the active area AA from being damaged.

Some patterns that are separated from the control layer EL or the second electrode E2 may be disposed inside each of the first groove part GV1 and the second groove part GV2 and be covered by at least one of the first inorganic layer 61 or the second inorganic layer 63. Thus, in the manufacturing process of the electronic panel EP, the influence of some patterns due to the movement to other elements may be prevented. Thus, process reliability of the electronic panel EP may be improved. However, this is merely an example. For example, in the electronic panel EP according to an exemplary embodiment, the groove parts GV1 and GV2 may be provided singly or omitted, and is not limited to a specific structure.

The dam part DM is disposed on the panel module area MAb to partition the formation area of the organic layer 62 into predetermined areas and prevent the organic layer 62 from being additionally expanded. The dam part DM may be disposed between the first and second groove parts GV1 and GV2. The dam part DM is illustrated in a laminated structure including a plurality of insulation patterns IP1 and IP2. However, this is merely an example. For example, the dam part DM may have a single layer structure, and the exemplary embodiments are not limited to a specific structure.

The planarization pattern OCT includes an organic material. The planarization pattern OCT may be disposed on the front surface of the panel module area MAb. The planarization pattern OCT covers a non-planarization surface provided on the panel module area MAb by the dam part DM or the groove parts GV1 and GV2 to provide a flat surface thereon. Thus, the flat surface may be stably provided even on an area on which the organic layer 62 is not disposed on the panel module area MAb.

The planarization pattern OCT may be optically transparent. For example, the planarization pattern OCT may have a visible light transmittance of about 90% or more.

The first inorganic layer 61 according to an exemplary embodiment may be removed from the central region CA. The first inorganic layer 61 may have a relatively low transmittance compared to the second inorganic layer 63. According to an exemplary embodiment, the transmittance of the central area CA may be improved by providing the first inorganic layer 61 in a shape that does not overlap the central area CA.

Also, the electronic panel EP according to an exemplary embodiment may further include an alignment mark AM. The alignment mark AM may be disposed on the pattern area PA. The alignment mark AM and any one of the first sensing pattern SP1, the second sensing pattern SP2, and the second auxiliary pattern CP2 may be provided on the same layer. In the example illustrated in FIG. 11, the alignment mark AM is disposed between the first sensing insulation layer 71 and the second sensing insulation layer 72, but the exemplary embodiments are not limited thereto. For example, the alignment mark AM may be disposed between the second sensing insulation layer 72 and the third sensing insulation layer 73. In another exemplary embodiment, the alignment mark AM may be disposed in an embossed or intaglio shape on the third sensing insulation layer 73.

The alignment mark AM may include a metal or inorganic insulation material. The alignment mark AM may be patterned through dry etching or wet etching or may be patterned using a laser. The alignment mark AM may be formed through various processes and the exemplary embodiments are not limited to a specific process or structure. The alignment mark AM may be optically opaque. In the exemplary embodiment illustrated in FIG. 8, the alignment mark AM overlaps the light blocking pattern area BMA of the window WM and thus may not be visible by the user.

Referring to FIGS. 8 and 11, an alignment device aligns the positions of the electronic panel EP and the window WM so as to bond the electronic panel EP to the window WM. The alignment device includes a camera, and the camera photographs the alignment mark AM of the panel module area MAb at an upper side of the electronic panel EP. The alignment device may identify the alignment mark AM included in an image received through the camera and align the positions of the electronic panel EP and the window WM with respect to the identified alignment mark AM.

The alignment mark AM may have various geometric patterns that are identified by the alignment device and are easy to be identified when a line segment and a pattern having line segments intersect. For example, the alignment mark AM may be in the form of a character shape such as "H", "T", "F", "X", "⌐", "L", "⊥", "T", and the like.

The alignment mark AM may be disposed not only in the panel module area MAb but also in the bezel area BZA of the display device DD1 illustrated in FIG. 1. However, the display device DD2 illustrated in FIG. 2 and the display device DD3 illustrated in FIG. 3 do not include the bezel area adjacent to the display area DA.

Each of the display devices DD1, DD2, and DD3 includes the alignment mark AM the panel module area MAb of the electronic panel EP. Accordingly, the alignment device may easily align the positions of the electronic panel EP and the window WM using the alignment mark AM even in the display device that does not include the bezel area.

Figure 12:
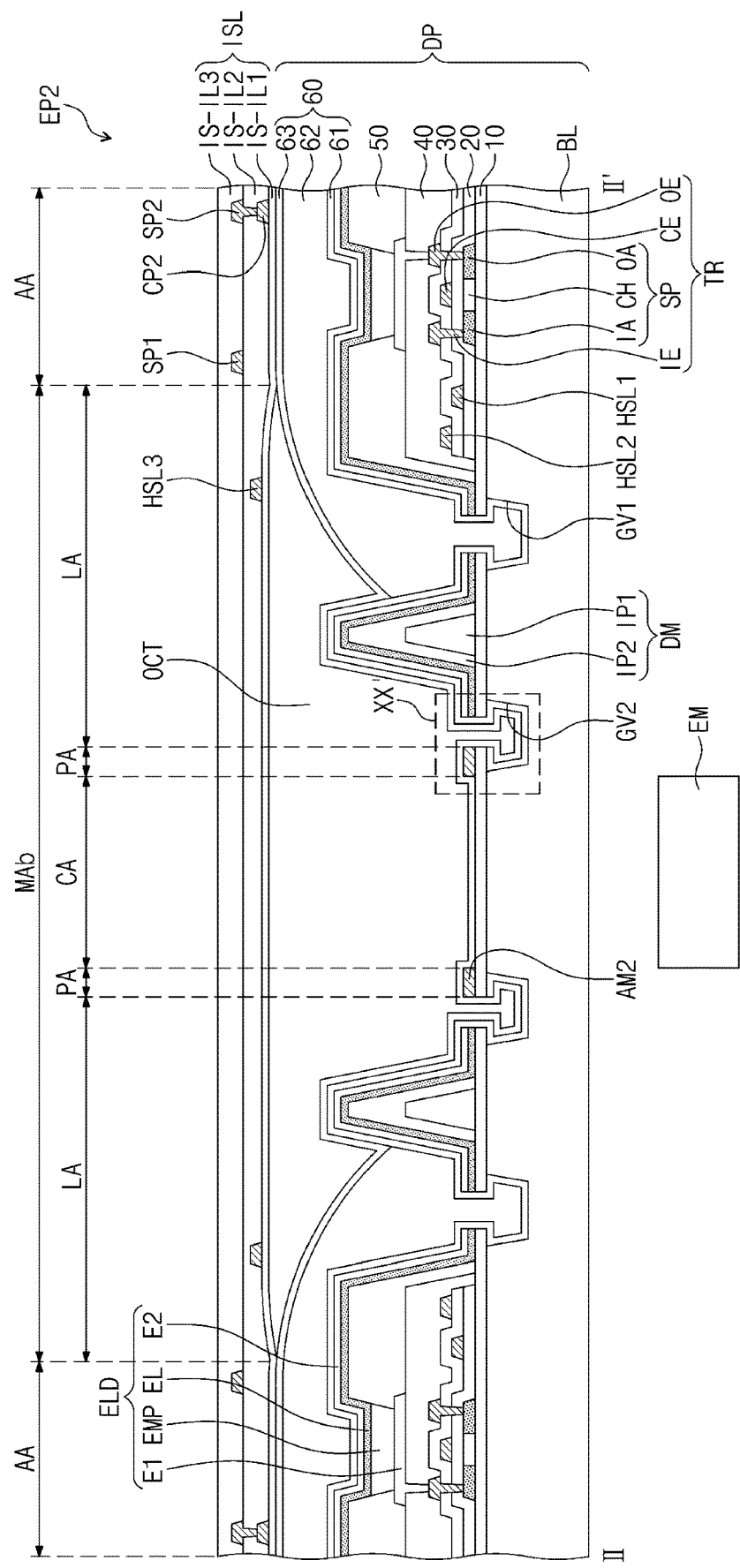
FIG. 12 is a cross-sectional view taken along line II-II' of FIG. 4 illustrating another embodiment of the electronic panel.

FIG. 12 is a cross-sectional view taken along line II-IF of FIG. 4 illustrating another example of an electronic panel.

FIG. 12 illustrates some components of the display panel DP and the input sensing layer ISL among the components of the electronic panel EP2 for easy description. Also, the same components as the electronic panel EP illustrated in FIG. 11 are denoted by the same reference symbol, and duplicated description will be omitted for descriptive convenience.

As illustrated in FIG. 12, the electronic panel EP2 includes an alignment mark AM2. The alignment mark AM2 may be disposed in the pattern area PA. For example, the alignment mark AM2 is disposed between a first insulation layer 10 and a second inorganic layer 63, but the exemplary embodiments are not limited thereto. In another exemplary embodiment, the alignment mark AM2 may be disposed in an embossed or intaglio shape on the first insulation layer 10. Also, the alignment mark AM2 may include a plurality of layers that are sequentially laminated.

The alignment mark AM2 may include a metal or inorganic insulating material. The alignment mark AM2 may be patterned through dry etching or wet etching or may be patterned using a laser. The alignment mark AM2 may be formed through various processes and the exemplary embodiments are not limited to a specific process. The alignment mark AM2 may be optically opaque. The alignment mark AM2 overlaps the light blocking pattern area BMA of the window WM as illustrated in FIG. 8, and thus may not be visible by the user.

Each of the display devices DD1, DD2, and DD3, which are illustrated in FIGS. 1 to 3, includes the alignment mark AM2 in the panel module area MAb of the electronic panel EP2. Accordingly, the alignment device may easily align the positions of the electronic panel EP2 and the window WM using the alignment mark AM2 even on the display device that does not include the bezel area.

Figure 13:
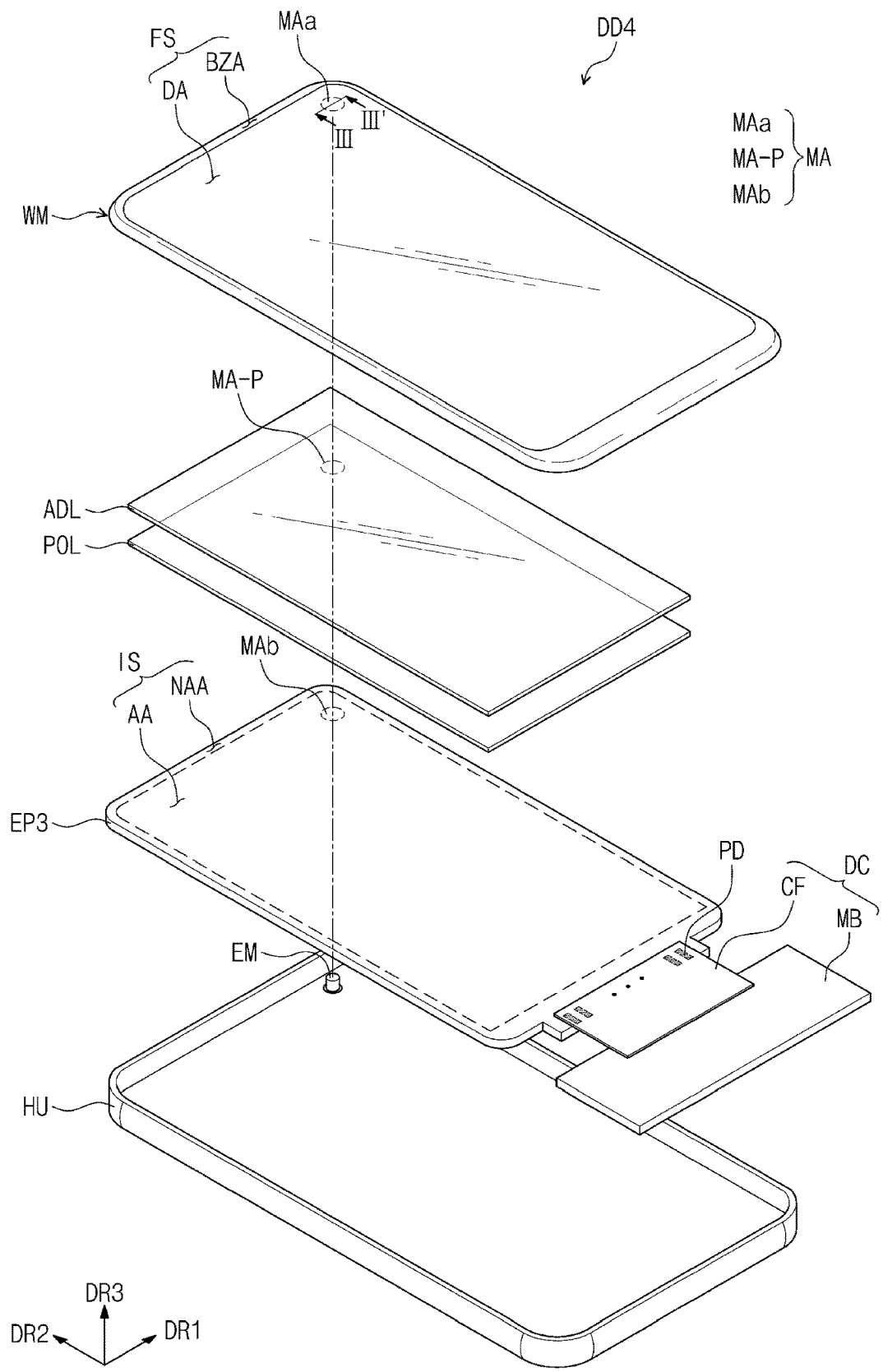
FIG. 13 is an exploded perspective view of another exemplary embodiment of a display device constructed according to the principles of the invention.
Figure 14:
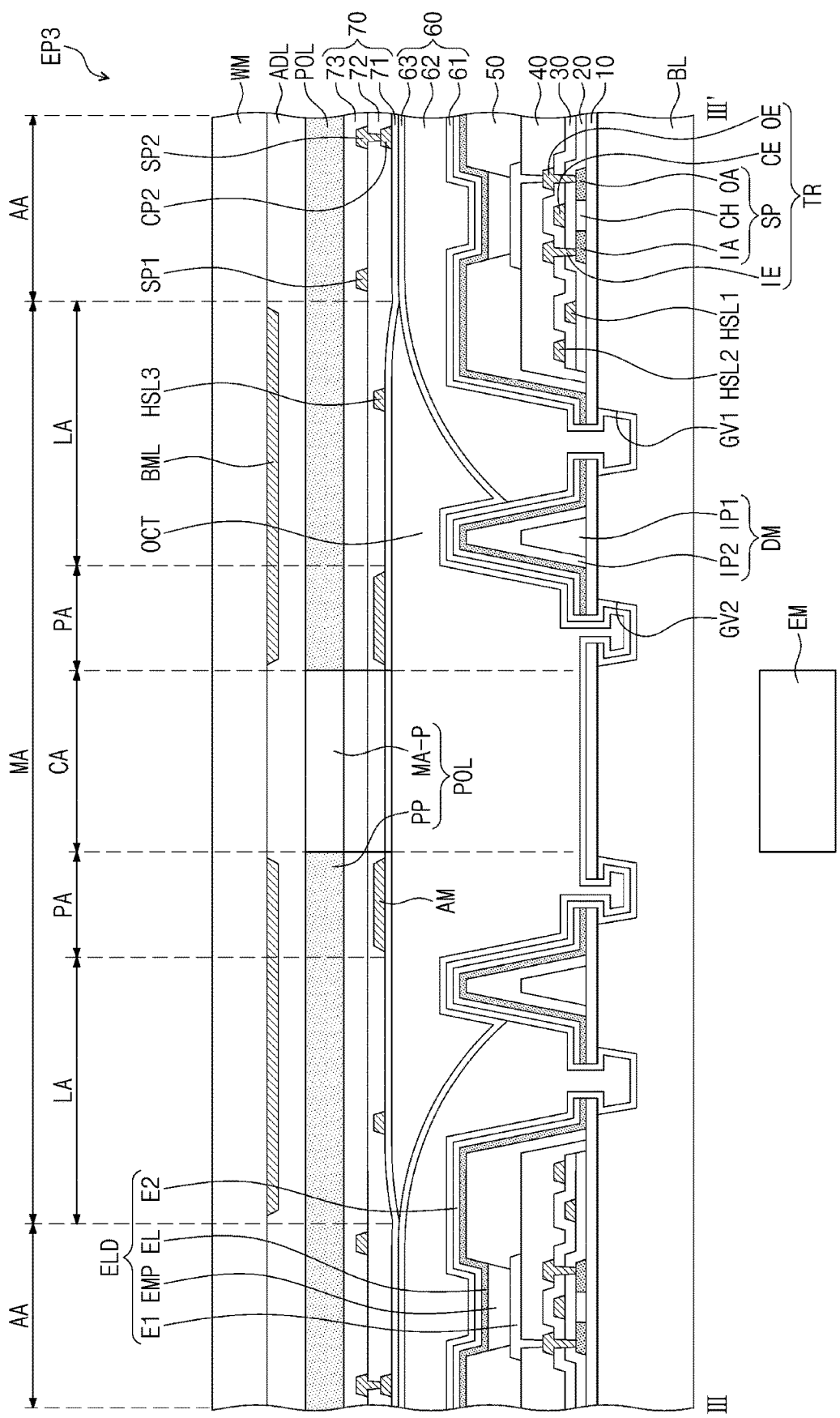
FIG. 14 is a cross-sectional view taken along line of FIG. 13.

FIG. 13 is an exploded perspective view of another exemplary embodiment of a display device constructed according to the principles of the invention. FIG. 14 is a cross-sectional view taken along line of FIG. 13.

As illustrated in FIG. 13, the display device DD4 may further include an anti-reflection member POL and an adhesive member ADL when compared to the display device DD1 illustrated in FIG. 4. A module area MA may be defined in a display area DA of the display device DD4. The module area MA may be an area that overlaps an electronic module EM. A window module area MAa of a window WM, a hole part MA-P of an anti-reflection member POL, a panel module area MAb of an electronic panel EP3 and an electronic module EM are defined at positions that overlap each other in a plan view. Also, in a position in which the window WM, the anti-reflection member POL, and the electronic panel EP3 are bonded to each other, the window module area MAa, the hole part MA-P, and the panel module area MAb overlap the module area MA.

The anti-reflection member POL may be disposed between the window WM and the electronic panel EP3. The anti-reflection member POL reduces a reflectance of external light (hereinafter, referred to as external light) incident into the outside of the window WM to the electronic panel EP3. In this exemplary embodiment, the anti-reflection member POL may include a polarizing film or a color filter.

An adhesive member ADL is disposed between the anti-reflection member POL and the window WM. The adhesive member ADL bonds the anti-reflection member POL to the window WM. When the anti-reflection member POL according to an exemplary embodiment is the color filter disposed on the electronic panel EP3, the adhesive member ADL may substantially bond the electronic panel EP3 to the window WM. The adhesive member ADL may include an optical clear adhesive, an optical clear resin, or a pressure sensitive adhesive. However, exemplary embodiments are not limited thereto.

The anti-reflection member POL according to an exemplary embodiment may include a hole part MA-P. The hole part MA-P may be defined at a position corresponding to a central area CA. The hole part MA-P may be a portion having a transmittance greater than that of the surrounding.

As illustrated in FIG. 14, the anti-reflection member POL may include the hole part MA-P and a polarizing part PP. The polarizing part PP may be a portion having polarization characteristics and may be a portion except for the hole part MA-P. The polarizing part PP overlaps an active area AA, a line area LA, and a pattern area PA.

The hole part MA-P may overlap the central area CA. The hole part MA-P may have a size corresponding to the central area CA. In this exemplary embodiment, the hole part MA-P may be defined by bleaching a portion of the anti-reflection member POL to remove the polarization characteristics. In another exemplary embodiment, the hole part MA-P may be a hole passing through the anti-reflection member POL.

The light blocking layer BML of the window WM overlaps the pattern area PA and the line area LA. Thus, an alignment mark AM and hole signal lines HSL1, HSL2, and HSL3 may not be visible by the user.

In display devices constructed according to the principles and exemplary embodiments of the invention, the electronic modules may be disposed within the active area of the display panel. The bezel area of the display device may be minimized, and the active area of the display device may be maximized. Furthermore, the alignment mark may be disposed in the module area, in which the electronic module is disposed, within the active area of the display panel, and thus, the display panel and the window module may be easily coupled to each other. Therefore, the production efficiency may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a camera; and
an electronic panel including:
a first area overlapping the camera;
a second area surrounding at least a portion of the first area in a plan view;
an indicia disposed in the first area; and
a light blocking layer, wherein:
the first area comprises a panel module area including a central area, a pattern area surrounding the central area and a line area surrounding the pattern area,
the second area comprises an active area,
the line area comprises a hole signal line providing an electrical signal,
the indicia comprises an alignment mark disposed in the pattern area,
the alignment mark and the hole signal line disposed on a same layer, and
the light blocking layer overlaps the alignment mark and the hole signal line in a plan view.

2. The display device of claim 1, wherein the electronic panel further comprises:
a base layer;
a plurality of pixels disposed in the active area on the base layer; and
an encapsulation layer disposed on the base layer to cover the pixels,
wherein the alignment mark is disposed on the encapsulation layer.

3. The display device of claim 1, wherein the electronic panel further comprises:
a base layer;
a plurality of pixels disposed on the active area on the base layer;
an encapsulation layer disposed on the base layer to cover the pixels; and
an input sensing layer disposed on the encapsulation layer and comprising a plurality of sensing patterns and a plurality of sensing insulation layers disposed between the sensing patterns.

4. The display device of claim 3, wherein the alignment mark and one of the plurality of sensing patterns are disposed on a same layer.

5. The display device of claim 3, wherein the plurality of sensing insulation layers comprise a first sensing insulation layer and a second sensing insulation layer, and
the alignment mark is disposed between the first sensing insulation layer and the second sensing insulation layer.

6. The display device of claim 3, wherein the encapsulation layer comprises:
a first inorganic layer;
a second inorganic layer disposed on the first inorganic layer; and
an organic layer disposed between the first inorganic layer and the second inorganic layer,
wherein the first inorganic layer does not overlap the central area.

7. The display device of claim 6, wherein the second inorganic layer overlaps the central area.

8. The display device of claim 7, wherein the second inorganic layer has a light transmittance greater than that of the first inorganic layer.

9. The display device of claim 3, further comprising a window disposed on the encapsulation layer,
wherein the window comprises a window substrate including a window module area overlapping the panel module area in a plan view, and
wherein the light blocking layer disposed on the window module area on one surface of the window substrate.

10. The display device of claim 9, wherein the window module area comprises:
a transmission area overlapping the central area in a plan view; and
a light blocking pattern area surrounding the transmission area,
wherein the light blocking layer is disposed on the light blocking pattern area.

11. The display device of claim 10, wherein the light blocking pattern area overlaps the pattern area in a plan view.

12. The display device of claim 1, wherein the electronic panel further comprises:
a base layer;
an insulation layer disposed on the base layer;
a plurality of pixels disposed on the active area on the base layer; and
an encapsulation layer disposed on the base layer to cover the pixels,
wherein the alignment mark is disposed between the insulation layer and the encapsulation layer.

13. The display device of claim 1, wherein the indicia has conductivity.

14. The display device of claim 1, wherein the indicia is optically opaque.

15. A display device comprising:
a camera; and
an electronic panel that is divided into a first area overlapping the camera and second area surrounding at least a portion of the first area in a plan view,
wherein the electronic panel comprises:
a plurality of pixels disposed on the second area;
an encapsulation layer configured to cover the pixels;
an indicia disposed on the encapsulation layer overlapping the first area in a plan view, and
a light blocking layer,
wherein the first area comprises a panel module area including a central area, a pattern area surrounding the central area and a line area surrounding the pattern area,
the second area comprises an active area,
the line area comprises a hole signal line providing an electrical signal,
the indicia comprises an alignment mark disposed in the pattern area,
the alignment mark and the hole signal line disposed on a same layer, and
the light blocking layer overlaps the alignment mark and hole signal line in a plan view.

16. The display device of claim 15, wherein the encapsulation layer comprises:
a first inorganic layer;
a second inorganic layer disposed on the first inorganic layer; and
an organic layer disposed between the first inorganic layer and the second inorganic layer,
wherein the first inorganic layer does not overlap the central area, and the second inorganic layer overlaps the central area.

17. The display device of claim 15, further comprising a window disposed on the encapsulation layer,
wherein the window comprises:
a window substrate comprising a window module area overlapping the panel module area in a plan view; and
wherein the light blocking layer disposed on the window module area on one surface of the window substrate.

18. The display device of claim 17, wherein the window module area comprises:
a transmission area overlapping the central area in a plan view; and
a light blocking pattern area surrounding the transmission area,
wherein the light blocking layer is disposed on the light blocking pattern area.

* * * * *